United States Patent
Jiang et al.

(10) Patent No.: US 9,685,216 B2
(45) Date of Patent: Jun. 20, 2017

(54) NON-DESTRUCTIVE READOUT FERROELECTRIC MEMORY AS WELL AS METHOD OF PREPARING THE SAME AND METHOD OF OPERATING THE SAME

(71) Applicant: Fudan University, Shanghai (CN)

(72) Inventors: Anquan Jiang, Shanghai (CN); Jun Jiang, Shanghai (CN); Wenping Geng, Shanghai (CN); Zilong Bai, Shanghai (CN)

(73) Assignee: Fudan University, Shanghai (CN)

( * ) Notice: Subject to any disclaimer, the term of this patent is extended or adjusted under 35 U.S.C. 154(b) by 0 days.

(21) Appl. No.: 14/916,889

(22) PCT Filed: Jun. 26, 2015

(86) PCT No.: PCT/CN2015/082439
§ 371 (c)(1),
(2) Date: Mar. 4, 2016

(87) PCT Pub. No.: WO2016/115826
PCT Pub. Date: Jul. 28, 2016

(65) Prior Publication Data
US 2016/0358639 A1    Dec. 8, 2016

(30) Foreign Application Priority Data

Jan. 24, 2015 (CN) .......................... 2015 1 0036526
Jan. 24, 2015 (CN) .......................... 2015 1 0036586

(51) Int. Cl.
G11C 11/22    (2006.01)
H01L 27/115   (2017.01)
H01L 27/11507 (2017.01)

(52) U.S. Cl.
CPC ........ *G11C 11/2273* (2013.01); *G11C 11/221* (2013.01); *G11C 11/2275* (2013.01); *H01L 27/115* (2013.01); *H01L 27/11507* (2013.01)

(58) Field of Classification Search
CPC .............. G11C 11/2273; G11C 11/221; G11C 11/2275; H01L 27/11507
(Continued)

(56) References Cited

U.S. PATENT DOCUMENTS 5,835,400 A * 11/1998 Jeon .................... G11C 11/22
                                                         365/145
6,387,737 B1   5/2002 Yamazaki et al.
(Continued)

FOREIGN PATENT DOCUMENTS

CN     101084580 A     12/2007
CN     104637948 A     5/2015
CN     104637949 A     5/2015

OTHER PUBLICATIONS

PCT/CN2015/082439 International Search Report dated Oct. 28, 2015, 2 pages.

*Primary Examiner* — Pho M Luu
(74) *Attorney, Agent, or Firm* — Warner Norcross & Judd LLP

(57) ABSTRACT

A non-destructive readout ferroelectric memory as well as a method of preparing the ferroelectric memory and a method of operating the ferroelectric memory are disclosed. The ferroelectric memory comprises a ferroelectric thin film layer. The ferroelectric memory of the invention can realize a non-destructive readout by way of current, is suitable for a high density application, is simple in preparation and has a low cost.

31 Claims, 16 Drawing Sheets

(58) Field of Classification Search
USPC .......................................................... 365/145
See application file for complete search history.

(56) References Cited

U.S. PATENT DOCUMENTS

| | | | | |
|---|---|---|---|---|
| 6,975,529 | B2* | 12/2005 | Yamanobe | G11C 11/22 |
| | | | | 257/E21.009 |
| 7,154,768 | B2* | 12/2006 | Chen | G11C 11/22 |
| | | | | 365/145 |
| 7,266,007 | B2* | 9/2007 | Kijima | H01L 27/101 |
| | | | | 257/E27.071 |
| 7,428,162 | B2* | 9/2008 | Kijima | G11C 11/22 |
| | | | | 257/E21.664 |
| 7,598,556 | B2* | 10/2009 | Mikawa | H01L 27/11502 |
| | | | | 257/295 |
| 7,706,165 | B2* | 4/2010 | Leenders | H01L 27/101 |
| | | | | 257/40 |
| 2009/0039341 | A1 | 2/2009 | Marsman et al. | |
| 2016/0358639 | A1 | 12/2016 | Jiang et al. | |

\* cited by examiner (a) the process of write "1" operation (b) the process of write "0" operation (a) The process of write "1" operation (b) The process of write "0" operation (a) The process of read "1" operation (b) The process of read "0" operation

NON-DESTRUCTIVE READOUT FERROELECTRIC MEMORY AS WELL AS METHOD OF PREPARING THE SAME AND METHOD OF OPERATING THE SAME

CROSS-REFERENCE TO RELATED APPLICATIONS

This application is the National Stage of International Application No. PCT/CN2015/082439 filed on 26 Jun. 2015, which claims priority to and all advantages of Chinese Patent Application No. 201510036586.1 and Chinese Patent Application No. 201510036526.X, each filed on 24 Jan. 2015, the contents of which are hereby incorporated by reference.

FIELD OF THE INVENTION

The present invention pertains to the technical field of ferroelectric memory, specifically to a non-destructive readout ferroelectric memory, and in particular, to a ferroelectric memory which performs a non-destructive readout operation based on an electrode having a clearance, as well as a method of preparing the ferroelectric memory and a method of operating the ferroelectric memory.

BACKGROUND

Ferroelectric random access memory (FRAM) is a nonvolatile memory which stores data by using two different polarization orientations of a ferroelectric domain (or referred to as "electric domain") in an electric field as logic information ("0" or "1"), and can be also referred to as "ferroelectric memory".

The storage medium layer of a ferroelectric memory is a ferroelectric thin film layer having a reversible (or "switchable") ferroelectric domain. Currently, the fastest speed of reversing an electric domain that can be measured in a lab can reach up to 0.2 ns. In fact, it can be even faster. Usually, the reversing speed of electric domain determines the read-write time of the memory, a coercive voltage for electric domain reversing determines the read-write voltage of elements, and it will decrease almost in equal proportion to a reduction of the thickness of the thin film. Therefore, the ferroelectric memory has such advantages as fast speed of data reading, low drive voltage, high density of storage, etc., and has earned widespread attention and rapid development in recent years.

Currently, the ferroelectric memory can be mainly divided into two categories according to a basic mode of work or operation: a destructive readout (DRO) FRAM and a non-destructive readout (NDRO) FeFET.

The DRO FRAM uses a ferroelectric capacitor (which is a capacitor formed by using a ferroelectric thin film layer as the medium layer) to replace the conventional charge-storing capacitor, and uses a polarization reversal thereof to realize writing and reading of data. So far, all the ferroelectric memories applied in the market adopt this mode of operation, wherein one transistor T and one ferroelectric capacitor C (i.e., 1T1C) constitutes a storage unit, and the 1T1C storage unit serves as the basis for circuit design. During the read operation, a charge integrating method is used, wherein whether the electric domain of the ferroelectric thin film layer is reversed is determined by reading a voltage of a reference capacitor connected in series with the 1T1C storage unit, thus recognizing the logic information in the storage unit. In the read operation of such ferroelectric memory, the reading of voltage will lead to a reversal of electric domain of the ferroelectric thin film layer. Therefore, it has disadvantages that the reading of information is destructive, the liability is low, and the original logic information status has to be written back again after the reading operation. In addition, with the improvement of integration density of elements, the area of ferroelectric capacitor C of the storage unit is continuously decreasing, whereas the readout charge is in direct proportion to the area of ferroelectric capacitor C, and thus the charge that can be read out is also becoming less and less; when the size of the storage unit of elements is smaller than 260 nm, the current readout circuit substantially cannot recognize the logic information stored in the storage unit, thus severely hindering the development of ferroelectric memory towards a high density trend.

The non-destructive readout (NDRO) ferroelectric memory is a ferroelectric field effect transistor (FeFET) in which a MFS structure is formed by using a ferroelectric thin film layer to replace the gate medium layer of a conventional MOSFET. The magnitude of source-drain current $I_{ds}$ can be varied under a control over the polarization direction, the difference can reach up to several orders of magnitude, and a non-destructive reading of the stored information can be realized with a very small voltage. The NDRO ferroelectric memory has such characteristics as high density integration, high reading and writing speed, non-destructive accessing, low power consumption, etc. However, since the retention performance of logic information of this device is poor and typically reaches merely several days or several months, whereas the storage market usually demands a period of no less than 10 years. Therefore, this structure is currently still in the stage of lab research, and can not be practically applied to a memory product.

Therefore, the current commercially applied DRO ferroelectric memories are mainly read out in a way of charge integrating for a ferroelectric capacitance. As summarized above, it has a disadvantage of destructive readout, and data has to be re-written after readout, thus resulting in a plenty of erasing and re-writing operations, which will cause a reduction in reliability of devices and affect reading speed of data; moreover, such a reading principle restricts a scaling-down of the ferroelectric capacitance C, and has a low storage density. For example, the current commercially applied ferroelectric memories have only 8 MB at most.

SUMMARY OF THE INVENTION

The objection of the invention is to provide a ferroelectric memory which can realize a non-destructive readout in a way of current reading and which has a good storage performance, as well as a method of preparing the ferroelectric memory and a method of operating the ferroelectric memory.

In order to realize the above object, the invention provides the following technical solutions.

According to an aspect of the invention, a non-destructive readout ferroelectric memory is provided, which comprises a ferroelectric thin film layer and a first electrode layer at least partially disposed on the ferroelectric thin film layer, wherein a clearance is provided in the first electrode layer, the clearance is correspondingly located on the ferroelectric thin film layer and divides the first electrode layer into at least two portions, and a polarization direction of the electric domain in the ferroelectric thin film layer is substantially not in parallel with a normal line direction of the ferroelectric thin film layer;

wherein the ferroelectric thin film layer is configured such that when a read signal is biased between the two portions of the first electrode layer, an electric domain of a part of the ferroelectric thin film layer that corresponds to the clearance is partially reversed so that a domain wall conductive passage is established which enables the two portions of the first electrode layer to be electrically conductive.

According to another aspect of the invention, a method for preparing the above described non-destructive readout ferroelectric memory is provided, which comprises the following steps:

providing a substrate;
forming a ferroelectric thin film; and
forming a first electrode layer having the clearance on the ferroelectric thin film.

According to yet another aspect of the invention, a method for operating the above described non-destructive readout ferroelectric memory is provided, wherein during the reading operation, a read signal in a certain direction is biased between the two portions of the first electrode layer, and it is determined whether the domain wall conductive passage is successfully established by reading a magnitude of the current between the two portions, thus reading out the stored logic information.

BRIEF DESCRIPTION OF THE DRAWINGS

The above and other objectives and advantages of the invention will become thoroughly clear from the following detailed description in connection with the accompanying drawings, wherein identical or similar elements are denoted by identical reference numerals.

DETAILED DESCRIPTION OF THE INVENTION

Figure 1:
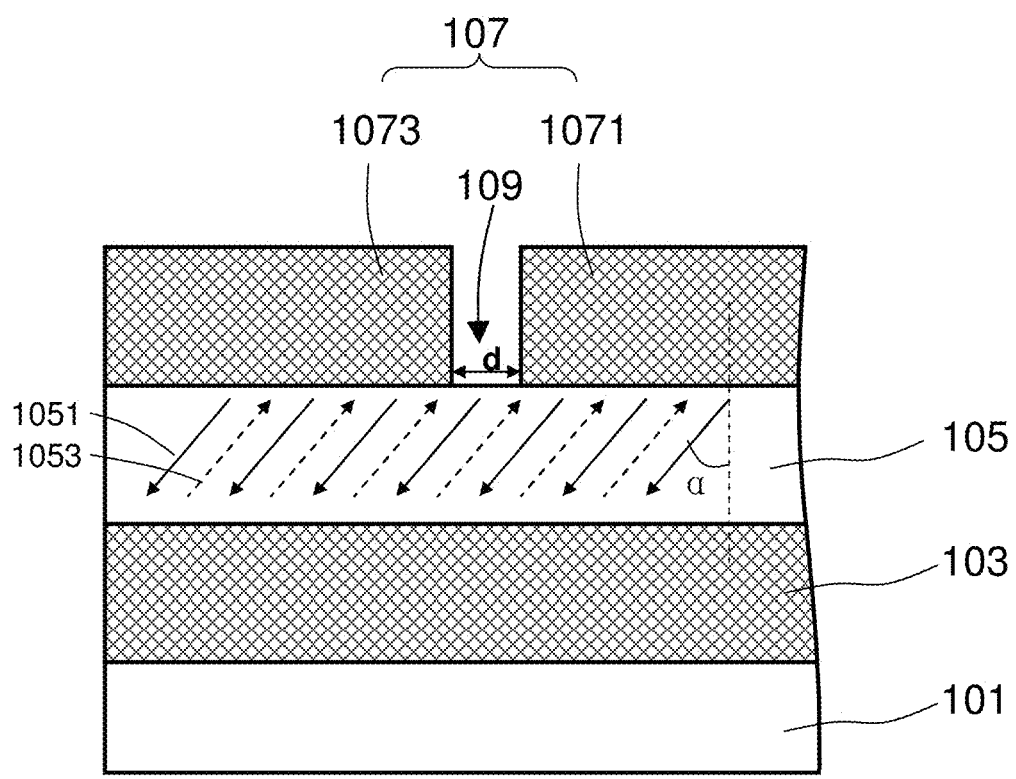
FIG. 1 is a schematic sectional structure view of a non-destructive readout ferroelectric memory according to a first embodiment of the invention.

Hereinafter, some of many possible embodiments of the invention will be described in order to provide a basic understanding of the invention and not to identify crucial or decisive elements of the invention or define the scope of protection.

In the drawings, the thicknesses of layers and areas have been exaggerated for clarity. The dimensional scaling relationship among the portions shown in the drawings does not reflect an actual dimensional scaling relationship.

In the following embodiments, an electric domain direction or polarization direction is illustratively given for the purpose of a clear description. However, it is to be understood that the electric domain direction or polarization direction of ferroelectric memory is not limited to the direction shown in the embodiment in the drawings.

Figure 2:
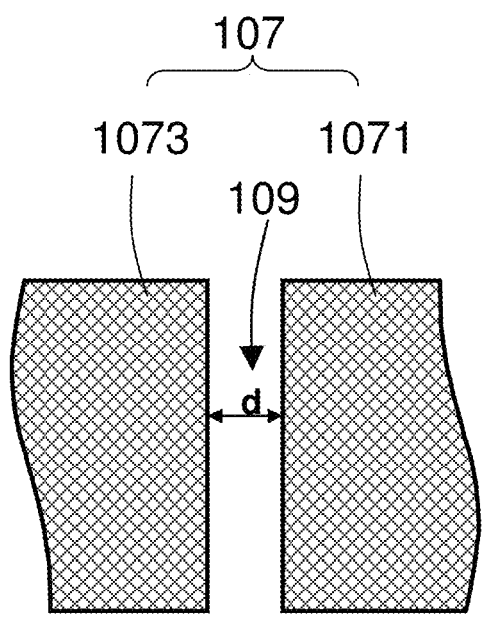
FIG. 2 is a top plan structure view of an upper electrode of the non-destructive readout ferroelectric memory shown in FIG. 1.

FIG. 1 is a schematic sectional structure view of a non-destructive readout ferroelectric memory according to a first embodiment of the invention; FIG. 2 is a top plan structure view of an upper electrode of the non-destructive readout ferroelectric memory shown in FIG. 1. As shown in FIG. 1, a partial sectional structure of the ferroelectric memory 10 is shown, which mainly comprises a substrate 101, a lower electrode layer 103, a ferroelectric thin film layer 105 and an upper electrode layer 107, wherein the upper electrode layer 107 is located on the ferroelectric thin film layer 105 and is in contact with the ferroelectric thin film layer 105, the upper electrode layer 107 is provided therein with a clearance 109 which divides the upper electrode layer 107 into several portions. In this example, the clearance 109 divides the upper electrode layer 107 into two portions, i.e., a read electrode portion 1071 and a read electrode portion 1073 which constitute a read electrode pair. In this embodiment, this read electrode pair constitutes the upper electrode layer 107 of this embodiment, which can be also used for a write operation of the ferroelectric memory 10 in this embodiment.

The substrate 101 can be formed by various substrate materials commonly used in a ferroelectric memory, e.g., Si, $SrTiO_3$ or $LiNbO_3$. Usually, the material of the substrate 100 is mainly determined by the lower electrode layer 103 and the ferroelectric thin film layer 105 together. In this embodiment, the substrate 101 can be a Si substrate which is easily compatible with a semiconductor CMOS process and is advantageous for a massive production. In addition, the substrate material such as $SrTiO_3$ or $LiNbO_3$ is typically selected according to lattice constant requirements on the lower electrode layer 103 and the ferroelectric thin film layer 105 so that an epitaxial thin film layer with excellent performance is obtained.

The lower electrode layer 103 grows on the substrate 101 and can be formed of a conductive material having a low resistance. For example, the material of the lower electrode layer 103 can be selected from one of Pt, $SrRuO_3$ and $LaNiO_3$ or a combination of more than one of Pt, $SrRuO_3$ and $LaNiO_3$. The thickness of the lower electrode layer 103 can be 50-100 nm, e.g., 80 nm. The lower electrode layer 103 can be formed by, for example, but not limited to, thin film deposition methods such as sputtering, chemical vapor deposition (CVD), pulse laser deposition (PLD), etc.

The ferroelectric thin film layer 105 is formed below the lower electrode layer 103 and can be formed of any ferroelectric material having a suitable domain structure. Specifically, the material of the ferroelectric thin film layer 105 can be selected from the followings: $BiFeO_3$, $(Bi, La) FeO_3$, $(Pb, Zr) TiO_3$ or $LiNbO_3$; however, it is to be understood that the specific type of the ferroelectric material of the ferroelectric thin film layer 105 is not limiting, and those skilled in the art can select any type of ferroelectric material. The method for preparing the ferroelectric thin film layer 105 is also not limiting. For example, it can be formed by thin film deposition methods such as sputtering, chemical vapor deposition (CVD), pulse laser deposition (PLD), etc. The thickness of the ferroelectric thin film layer 105 can be in a range from larger than or equal to 5 nm to smaller than or equal to 500 nm, e.g., it could be 20 nm, 30 nm or 50 nm.

The read electrode portion 1071 and the read electrode portion 1073 in this embodiment can be formed by pattern etching the clearance 109 with a continuous metal thin film layer. Of course, in other embodiments, the read electrode portion 1071 and the read electrode portion 1073 can be formed by patterning respectively. In this specification, the read electrode portion 1071 and the read electrode portion 1073 form a read electrode pair. Herein, the term "read" reflects that they have at least the function of readout operation. However, the functions of the read electrode portion 1071 and the read electrode portion 1073 are not limited to this. For example, in this embodiment, the read electrode portion 1071 and the read electrode portion 1073 form the upper electrode 107 of the ferroelectric memory in the embodiment of the invention. The upper electrode 107 is located on the ferroelectric thin film layer 105 and is in contact with the ferroelectric thin film layer 105. The upper electrode 107 and the lower electrode layer 103 on the other side of the ferroelectric thin film layer 105 form an electrode pair for performing a write operation on the memory.

The read electrode portion 1071 and/or the read electrode portion 1073 can be formed of a conductive material having a low resistance. For example, the material of the read electrode portion 1071 and the read electrode portion 1073 can be selected from one of Pt, $SrRuO_3$ and $LaNiO_3$ or a combination of more than one of Pt, $SrRuO_3$ and $LaNiO_3$. The thickness of the read electrode portion 1071 and/or the read electrode portion 1073 can be 5-100 nm, e.g., 20 nm. The read electrode portion 1071 and/or the read electrode portion 1073 can be formed by, for example, but not limited to, thin film deposition methods such as sputtering, chemical vapor deposition (CVD), pulse laser deposition (PLD), etc.

The clearance 109 is used for realizing a relative electric isolation between the read electrode portion 1071 and the read electrode portion 1073 (the electric isolation does not include a following situation in which a domain wall conductive passage is established during a read operation process). The clearance 109 can be obtained by processing a flat metal layer with electron beam, nano-imprint or other photo-etching methods. However, the methods of forming the clearance 109 are not limited to the embodiments of the invention. The interval d of the clearance 109 can be in a range from larger than or equal to 2 nm to smaller than or equal to 500 nm, preferably from larger than or equal to 5 nm to smaller than or equal to 100 nm, e.g. it could be 10 nm, 135 nm, 125 nm, etc. A smaller interval d is more advantageous for improving a storage density of the ferroelectric memory, more advantageous for reducing a read voltage and increasing a read current, and will lead to less read power consumption. Therefore, the clearance 109 can be a clearance 109 having various nanometer-order dimensions. The shape of the clearance 109 is not limited to the shape shown in FIG. 2. In other embodiments, the clearance 109 can even have a serrated shape. The dimension of the width w (i.e., a width dimension of the clearance) of the read electrode portion 1071 and the read electrode portion 1073 in a direction perpendicular to the clearance can be in a range from larger than or equal to 5 nm to smaller than or equal to 500 nm, e.g., it could be 50 nm.

Figure 3:
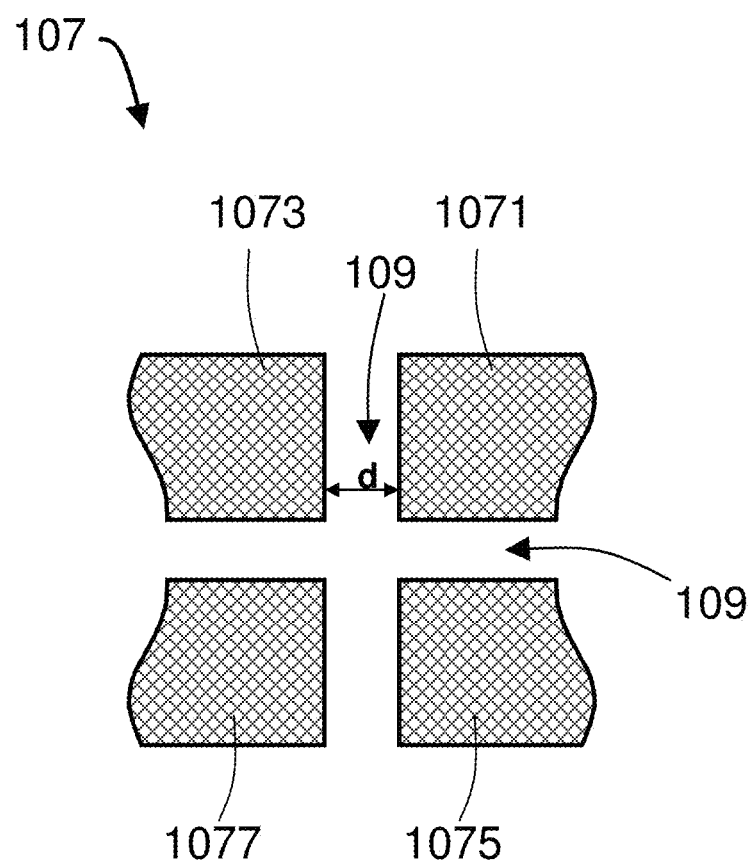
FIG. 3 is another top plan structure view of the upper electrode of the non-destructive readout ferroelectric memory shown in FIG. 1.

FIG. 3 is another top plan structure view of the upper electrode of the non-destructive readout ferroelectric memory shown in FIG. 1. In this embodiment, the clearance 109 divides the upper electrode layer 107 into four portions, i.e., a read electrode portion 1071, a read electrode portion 1073, a read electrode portion 1075 and a read electrode portion 1077. Any two adjacent read electrode portions on two sides of the clearance 109 can form a read electrode pair. For example, the read electrode portion 1073 and the read electrode portion 1077, as well as the read electrode portion 1075 and the read electrode portion 1077; of course, the four read electrode portions shown in FIG. 3 can also form a read electrode pair.

With continued reference to FIG. 1, in the invention, the ferroelectric thin film layer 105 is required to satisfy a condition that the ferroelectric domain thereof has a component both in and out of a plane, i.e., it has an in-plane component (a projection of spontaneous polarization of the ferroelectric domain onto a film plane) and an out-of-plane component (a projection of spontaneous polarization of the ferroelectric domain onto a plane perpendicular to the film plane). The ferroelectric thin film layer 105 can form electric domains 1051 and 1053 in two directions as shown in FIG. 1. The polarization direction of the electric domain 1051 is completely opposite to the polarization direction of the electric domain 1053. When a biasing voltage is larger than a coercive voltage, the electric domain will be oriented in the electric field direction. Therefore, when the biasing electric field direction is opposite to the original electric domain direction and the biasing voltage is larger than the coercive voltage, the electric domain 1051 or 1053 will be reversed. In this embodiment, the polarization direction of the electric domain of the ferroelectric thin film layer 105 is substantially not perpendicular to nor substantially parallel to a normal line (a broken line perpendicular to the ferroelectric thin film layer 105 as shown in the figure) direction of the ferroelectric thin film layer 105. Specifically, as shown in FIG. 1, an angle α formed between the normal line of the ferroelectric thin film layer 105 and the polarization direction of electric domain is not equal to 0°, 90°, 180° or 270°. For example, α=45°. In this way, the electric domain has an in-plane component and an out-of-plane component, thus facilitating a write operation and a read operation thereof. Specifically, it can be realized by controlling a crystal orientation in which the ferroelectric thin film layer 105 grows. By way of example, a $BiFeO_3$ ferroelectric thin film layer 105 having a thickness of 100 nm can grow epitaxially on the SrTiO3 lower electrode layer 103 having a crystal face (001), wherein the polarization direction of the electric domain of the $BiFeO_3$ ferroelectric thin film layer 105 is along a direction <111>.

It will be appreciated that in yet another embodiment, the clearance 109 can be correspondingly placed in the lower electrode layer 103 based on the way in which it is placed in the upper electrode layer 107. The expression "on the ferroelectric thin film layer" in claim 1 of the application is not limited to being construed as "above the ferroelectric thin film layer". Since there is a clearance in the "first electrode layer", the application can implement a non-destructive readout operation merely through "the first electrode layer".

Figure 4:
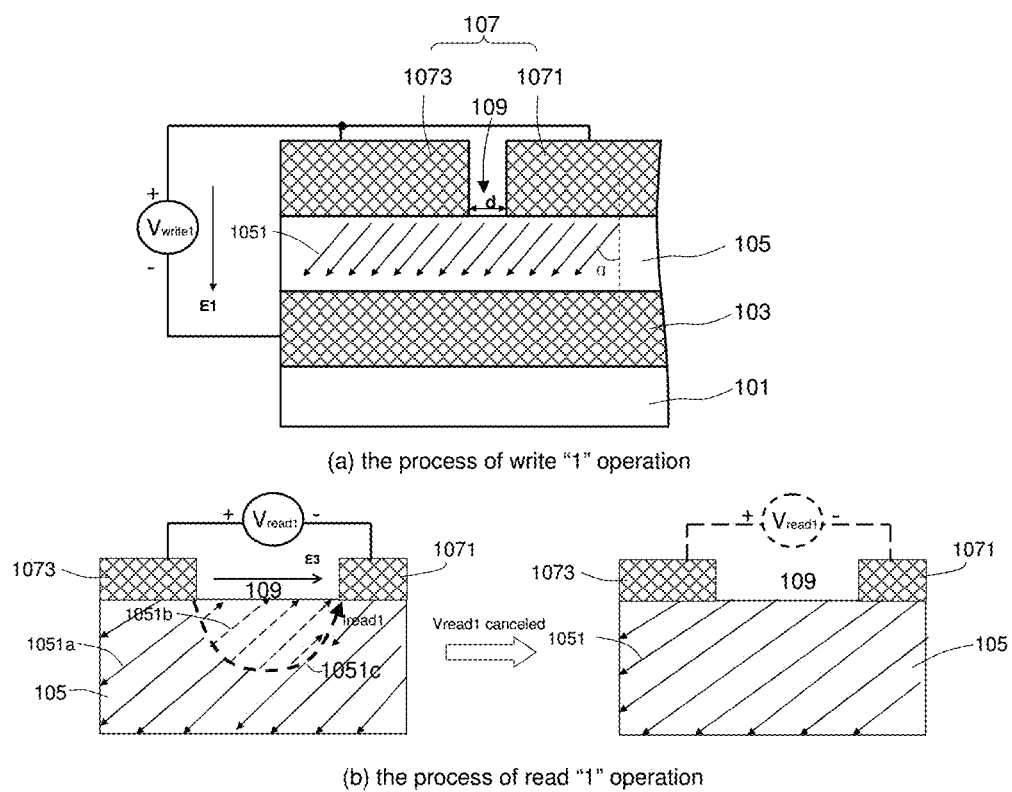
FIG. 4 is a schematic view showing the process and principle of the operation of writing "1" and reading "1" of the ferroelectric memory according to the embodiment shown in FIG. 1.
Figure 5:
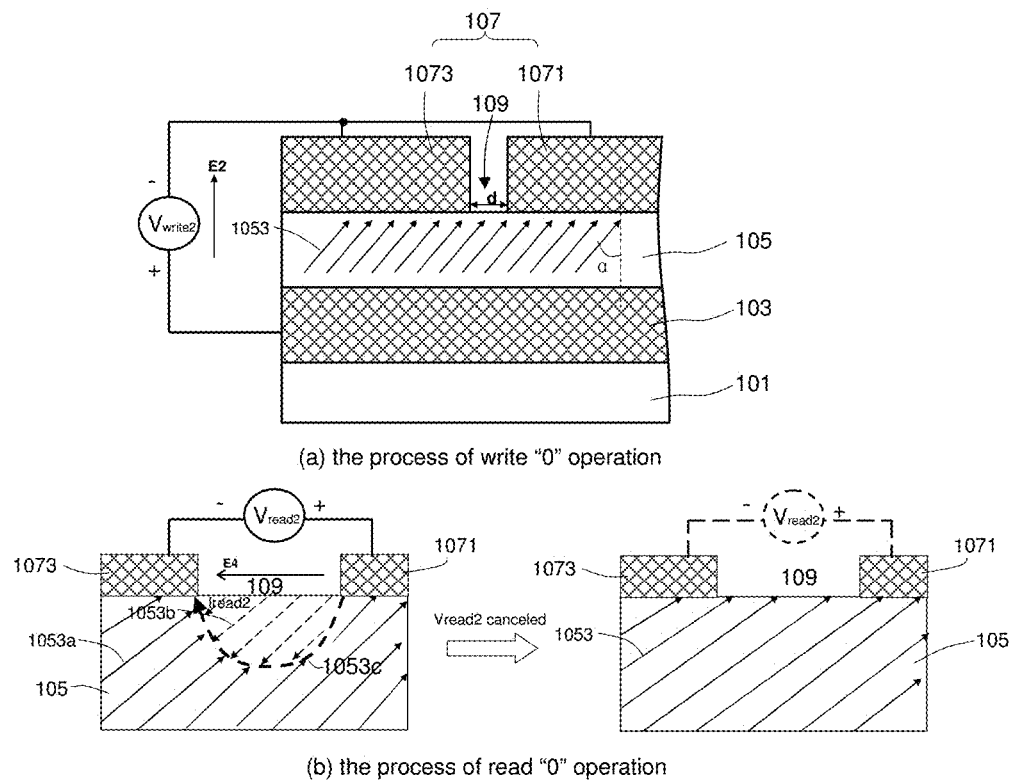
FIG. 5 is a schematic view showing the process and principle of the operation of writing "0" and reading "0" of the ferroelectric memory according to the embodiment shown in FIG. 1.

FIG. 4 is a schematic view showing the process and principle of the operation of writing "1" and reading "1" of the ferroelectric memory according to the embodiment shown in FIG. 1; FIG. 5 is a schematic view showing the process and principle of the operation of writing "0" and reading "0" of the ferroelectric memory according to the embodiment shown in FIG. 1.

In this embodiment, during a write operation, a voltage $V_{write}$ at least larger than a coercive electric field of the ferroelectric thin film layer 105 is applied between the upper electrode layer 107 and the lower electrode layer 103 so that electric domain is reversed, thus realizing a write-in of logic information "1" or "0" in the ferroelectric memory 10. Firstly, as shown in FIG. 4(a), the polarization direction of the electric domain 1051 shown in this figure represents storage information "1"; during an operation of writing "1", a write signal $V_{write1}$ larger than the coercive field of the ferroelectric thin film layer 105 is applied between the upper electrode layer 107 and the lower electrode layer 103 so that a positive voltage is biased onto the upper electrode layer 107 and a negative voltage is biased onto the lower electrode layer 103, thus forming an electric field E1 in the direction as shown in the figure in the ferroelectric thin film layer 105 (at this point, a "+" write voltage is defined). The electric domain is uniformly turned over so as to form the electric domain 1051 in the polarization direction as shown in the figure, thus realizing a write-in of memory logic information "1". On the contrary, as shown in FIG. 5(a), the polarization direction of the electric domain 1053 shown in this figure represents storage information "0"; during an operation of writing "0", a write signal $V_{write2}$ larger than the coercive field of the ferroelectric thin film layer 105 is applied between the upper electrode layer 107 and the lower electrode layer 103 so that a negative voltage is biased onto the upper electrode layer 107 and a positive voltage is biased onto the lower electrode layer 103, thus forming an electric field E2 in the direction as shown in the figure in the ferroelectric thin film layer 105 (at this point, a "−" write voltage is defined). The electric domain is uniformly turned over so as to form the electric domain 1053 in the polarization direction as shown in the figure, thus realizing a write-in of memory logic information "0".

The specific form of write signals $V_{write1}$ and $V_{write2}$ is not limiting. For example, it can be a voltage pulse signal with a certain frequency, etc.

In this embodiment, the principle of write operation is completely different from that of a conventional ferroelectric memory. Specifically, during a write operation, the lower electrode layer 103 needs no biasing signals and can be vacant, and a read signal $V_{read}$ is biased between the read electrode pair. Taking the biased read electrode portion 1071 and read electrode portion 1073 as an example and as shown in FIG. 4(b), during an operation of reading "1", a read voltage $V_{read1}$ is biased between the read electrode portion 1071 and the read electrode portion 1073, wherein the read electrode portion 1073 is biased in a positive direction, and the read electrode portion 1071 is biased in a negative direction, thus forming an electric field E3 in the direction as shown between the read electrode portion 1073 and the read electrode portion 1071 (at this point, a "+" read voltage is defined). Due to existence of the clearance 109, the electric field E3 can partially have an influence on the electric domain of a part of the ferroelectric thin film layer which corresponds to the clearance 109. As shown, with the increase of the electric field E3, in a corresponding part of the ferroelectric thin film layer 105 below the clearance 109, i.e., in a local part of the surface portion exposed to the clearance 109, the electric domain is reversed, i.e., the electric domain 1051 corresponding to the clearance 109 is partially reversed to form an electric domain 1051b as shown in FIG. 4(b), and the electric domain of other portions of the ferroelectric thin film layer 105 is not reversed since it is substantially not affected by the electric field E3 (or the influence by the electric field E3 is not sufficient to reverse the electric domain thereof), and correspondingly, an electric domain 1051a as shown is formed, wherein the polarization direction of the electric domain 1051b is substantially opposite to that of the electric domain 1051a. The electric domain 1051b is reversed using an electric component of the electric field E3 in a direction opposite to the polarization direction of the electric domain 1051a. Therefore, in case that the coercive voltage of the ferroelectric thin film layer is known, a minimum voltage for forming the electric domain 1051b can be calculated, i.e., a minimum read voltage $V_{read1}$.

At this point, at a adjoining portion between a portion of the ferroelectric thin film layer having the electric domain 1051a and a portion of the ferroelectric thin film layer having the electric domain 1051b, i.e., at a boundary wall or interface between the electric domain 1051a and the electric domain 1051b, a domain wall or domain boundary 1051c having charges is generated. Therefore, mainly on the basis of domain wall conductive mechanism, a conductive passage is created between the read electrode portion 1073 and the read electrode portion 1071, i.e., "domain wall conductive passage", and correspondingly, a read current signal $I_{read1}$ is generated. At this point, it means that a logic signal "1" is read out. Therefore, the process of read operation is completely different from the charge readout method in a ferroelectric memory having a conventional capacitor structure. In the embodiments of the application, a way is implemented in which logic signals are read by current.

Further, after the current signal $I_{read1}$ is read out, the read voltage signal $V_{read1}$ between the read electrode portion 1073 and the read electrode portion 1071 is removed; as shown in FIG. 4(b), the electric field E3 disappears. At this point, under the effect of de-polarization field, the electric domain 1051b will be influenced by the electric domain 1051a and will be reversed to substantially the original polarization direction. That is, the electric domain 1051b disappears instantly and substantially restores to the electric domain 1051 in the original state (a state before the read operation). The domain wall 1051c also substantially disappears, and the conductive passage generated previously also disappears (even if the conductive passage does not disappear, it will substantially have no influence on the status of the data it stores). Therefore, the logic information "1" stored by the ferroelectric memory 10 before the read operation does not change after the read operation, thus realizing a non-destructive accessing. In this embodiment, it would be better for the volume of a portion of the ferroelectric thin film layer having the electric domain 1051b to be as small as possible as compared to a portion of the volume of the ferroelectric thin film layer having the electric domain 1051a, i.e., it would be better for the proportion of the portion of the ferroelectric thin film layer having an electric domain (e.g., electric domain 1051b) which is partially reversed during the read operation to be as small as possible. By designing the thickness of the ferroelectric thin film layer 105, area parameters and/or the interval d of the clearance 109, the read operation performance of the ferroelectric memory can be optimized. For example, the interval d of the clearance 109 is smaller than or equal to a half of the thickness of the ferroelectric thin film layer 105, or the interval d is one fourth of the thickness of the ferroelectric thin film layer 105.

By contrast, as shown in FIG. 5(b), during a reading "0" operation, a read voltage $V_{read2}$ is biased between the read electrode portion 1071 and the read electrode portion 1073, wherein the read electrode portion 1073 is biased in a negative direction, and the read electrode portion 1071 is biased in a positive direction, thus forming an electric field E4 in the direction as shown between the read electrode portion 1071 and the read electrode portion 1073 (at this point, a "−" read voltage is defined). Due to existence of the clearance 109, the electric field E4 can partially have an influence on the electric domain of a part of the ferroelectric thin film layer which corresponds to the clearance 109. As shown, with the increase of the electric field E4, in a corresponding part of the ferroelectric thin film layer 105 below the clearance 109, i.e., in a local part of the surface portion exposed to the clearance 109, the electric domain is reversed, i.e., the electric domain 1053 corresponding to the clearance 109 is partially reversed to form an electric domain 1053b as shown in FIG. 5(b), and the electric domain of other portions of the ferroelectric thin film layer 105 is not reversed since it is substantially not affected by the electric field E4 (or the influence by the electric field E4 is not sufficient to reverse the electric domain thereof), and correspondingly, an electric domain 1053a as shown is formed, wherein the polarization direction of the electric domain 1053b is substantially opposite to that of the electric domain 1053a. The electric domain 1053b is reversed using an electric component of the electric field E4 in a direction opposite to the polarization direction of the electric domain 1053a. Therefore, in case that the coercive voltage of the ferroelectric thin film layer is known, a minimum read voltage $V_{read2}$ for forming the electric domain 1053b can be calculated.

At this point, at a adjoining portion between a portion of the ferroelectric thin film layer having the electric domain 1053a and a portion of the ferroelectric thin film layer having the electric domain 1053b, i.e., at a boundary wall or interface between the electric domain 1053a and the electric domain 1053b, a domain wall or domain boundary 1053c having charges is generated. Therefore, mainly on the basis of domain wall conductive mechanism, a conductive passage is created between the read electrode portion 1071 and the read electrode portion 1073, i.e., "domain wall conductive passage", and correspondingly, a read current signal $I_{read2}$ is generated. At this point, it means that a logic signal "0" is read out.

After the current signal $I_{read2}$ is read out, the read voltage signal $V_{read2}$ between the read electrode portion 1071 and the read electrode portion 1073 is removed; as shown in FIG. 5(b), the electric field E4 disappears. At this point, under the effect of de-polarization field, the electric domain 1053b will be influenced by the electric domain 1053a and will be reversed to substantially the original polarization direction. That is, the electric domain 1053b disappears instantly and substantially restores to the electric domain 1053 in the original state (a state before the read operation). The domain wall 1053c also substantially disappears, and the conductive passage generated previously also disappears. Therefore, the logic information "0" stored by the ferroelectric memory 10 before the read operation does not change after the read operation, thus realizing a non-destructive accessing. The principle of read "1" operation shown above in FIG. 4(b) is substantially the same as that of read "0" operation shown in FIG. 5(b). It will be understood that in the read "1" operation, the read voltage $V_{read2}$ shown in FIG. 5(b) can be also biased between the read electrode portion 1071 and the read electrode portion 1073; therefore, no domain wall conductive passage will be created between the read electrode portion 1071 and the read electrode portion 1073, and the read current is substantially 0. At this point, it means that logic information "1" is readout; similarly, in the read "0" operation, the read voltage $V_{read1}$ shown in FIG. 4(b) can be also biased between the read electrode portion 1071 and the read electrode portion 1073; therefore, no domain wall conductive passage will be created between the read electrode portion 1071 and the read electrode portion 1073, and the read current is substantially 0. At this point, it means that logic information "0" is readout. Therefore, those skilled in the art will appreciate that the use of read voltage signal in any direction can realize the read "1" and read "0" operations on the ferroelectric memory of the invention.

Figure 6:
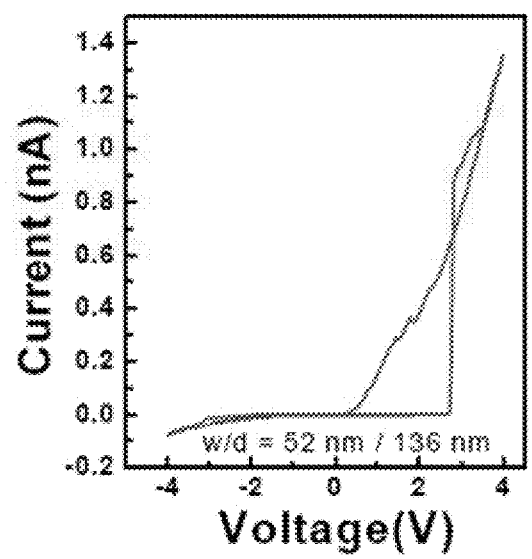
FIG. 6 is an I-V graph in an operation of sweeping the voltage across the read electrode pair of the ferroelectric memory having stored logic information of "1" according to the first embodiment of the invention.

FIG. 6 is an I-V graph in an operation of sweeping the voltage across the read electrode pair of the ferroelectric memory having stored logic information of "1" according to the first embodiment of the invention. In connection with the ferroelectric memory having stored logic information "1" shown in FIG. 4(*a*) and taking a clearance d=136 nm and a read electrode portion width w=52 nm as an example, firstly, a "+" direction sweeping is performed, and an electric field similar to the electric field E3 shown in FIG. 4(*b*) is formed between the read electrode pair. With the increase of the electric field, the electric domain of a local part of the surface portion exposed to the clearance 109 is reversed, and an electric domain such as the electric domain 1051*b* as shown in FIG. 4(*a*) is gradually formed, which forms an angle of 71° or 109° or 180° with the original electric domain. The domain wall or domain boundary having charges is enlarged gradually. When the voltage in increased to about +2.4V, the current between the read electrode pair is increased suddenly, and it means that now a domain wall conductive passage which connects the read electrode pair is formed in the ferroelectric thin film layer, and the read current is in an "on state (on)"; when the read electric field is decreased gradually or disappears, the reversed electric domain will instantly restore to the original state, and the domain wall conductive passage is closed. On the contrary, when the voltage is applied by sweeping in a "−" direction, an electric field similar to the electric field E4 shown in FIG. 5(*b*) is formed between the read electrode pair, and a conductive domain wall or domain boundary cannot be formed in the ferroelectric thin film layer. It means that no domain wall conductive passage is formed in the ferroelectric thin film layer, the read current is always very small and is in an "off state".

Figure 7:
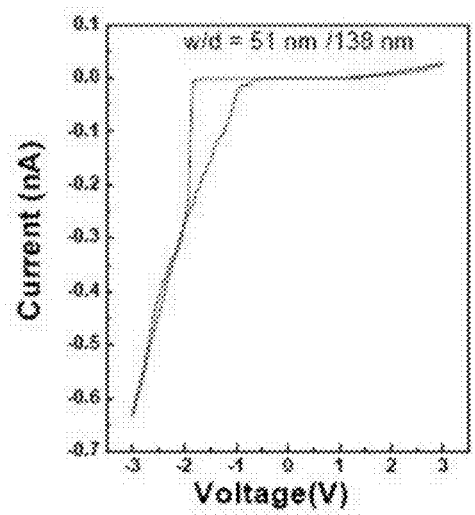
FIG. 7 is an I-V graph in an operation of sweeping the voltage across the read electrode pair of the ferroelectric memory having stored logic information of "0" according to the first embodiment of the invention.

FIG. 7 is an I-V graph in an operation of sweeping the voltage across the read electrode pair of the ferroelectric memory having stored logic information of "0" according to the first embodiment of the invention. In connection with the ferroelectric memory having stored logic information "0" shown in FIG. 5(*a*) and taking a clearance d=138 nm and a read electrode portion width w=51 nm as an example, firstly, a "−" direction sweeping is performed, and an electric field similar to the electric field E4 shown in FIG. 5(*b*) is formed between the read electrode pair. When the voltage in increased to about −1.8V, the current between the read electrode pair is increased suddenly, and it means that now a domain wall conductive passage which connects the read electrode pair is formed in the ferroelectric thin film layer, and the read current is in an "on state" (on); when the read electric field is decreased gradually or disappears, the reversed electric domain will instantly restore to the original state, and the domain wall conductive passage is closed. Then, a "+" direction sweeping is performed, an electric field similar to the electric field E4 shown in FIG. 4(*b*) is formed between the read electrode pair, and the current between the read electrode pair is very small. It means that no domain wall conductive passage is formed in the ferroelectric thin film layer, and the read current is in an "off state" (off).

Figure 8:
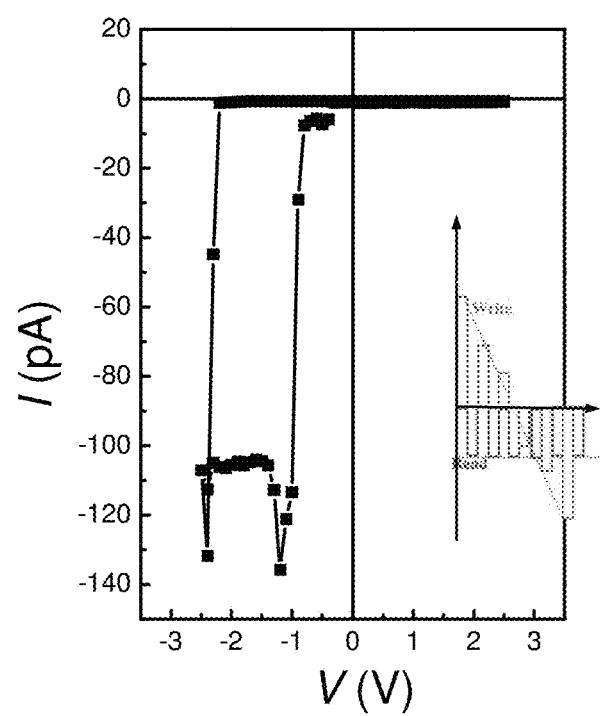
FIG. 8 is a schematic I-V graph showing the variation of readout current with a write voltage for a certain fixed readout voltage of the read electrode pair of the ferroelectric memory according to the first embodiment of the invention.

FIG. 8 is a schematic I-V graph of the read electrode pair of the ferroelectric memory according to the first embodiment of the invention under different read and write pulses, wherein the readout voltage is fixed at −1.5V. As can be seen from this figure that in this embodiment, the on-state voltage (i.e., a voltage for forming the domain wall conductive passage) is about −2.5V, and an off-state voltage (i.e., a voltage for forming the domain wall conductive passage cut-off) is about −1V; when a "+" direction voltage is applied, a conductive domain wall or domain boundary cannot be formed, and the read current is always in an on-state.

All of the I-V graphs in the embodiment shown in FIGS. 6-8 can prove that the ferroelectric memory 10 according to the embodiment of the invention can realize a non-destructive readout operation, that is, under the effect of depolarization field, the domain wall conductive passage will disappear, and an "on-state" will return to an "off-stage".

Figure 9:
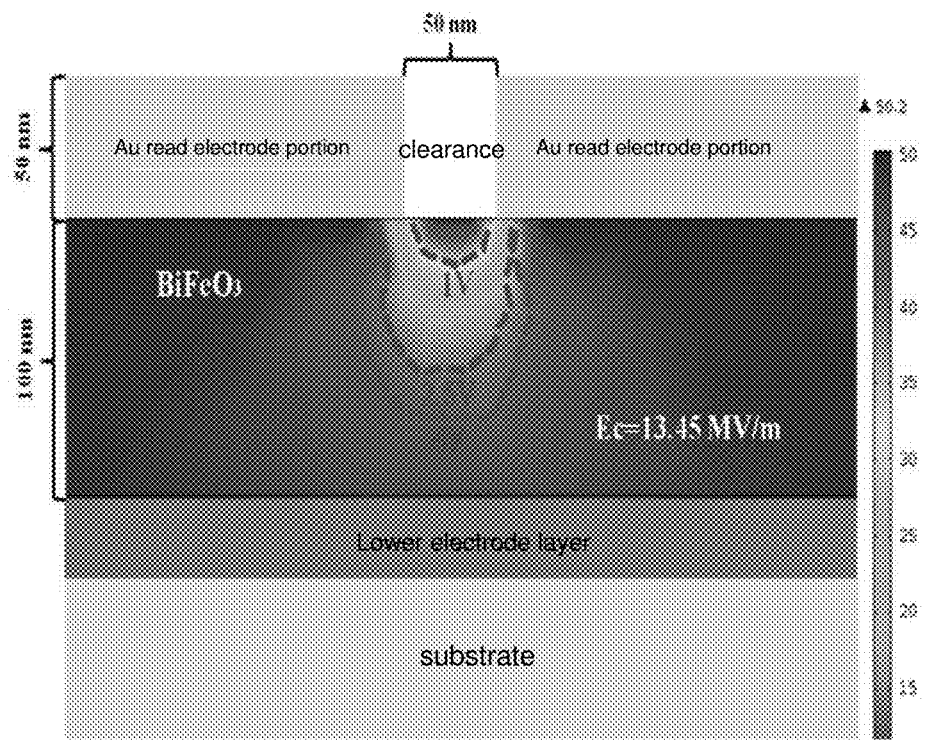
FIG. 9 is a schematic view showing the distribution of an electric field when a read signal is biased on the read electrode pair of the ferroelectric memory according to the embodiment of the invention.

FIG. 9 is a schematic view showing the distribution of an electric field when a read signal is biased on the read electrode pair of the ferroelectric memory according to the embodiment of the invention, wherein a variation of the distribution of the depth of electric field of ferroelectric thin film layer corresponding to the clearance with the voltage of read signal is shown. In this embodiment, the read electrode pair is constituted by two Au read electrode portions, and a read signal is applied onto the read electrode pair. The ferroelectric thin film layer is $BiFeO_3$, the coercive electric field thereof is 13.45 MV/m, and the dimensional parameters of the read electrode pair, the clearance and the ferroelectric thin film layer are shown in FIG. 9; as shown in FIG. 9, the distribution of the depth of electric field of ferroelectric thin film layer at the clearance is varied according to an externally applied read voltage. When a read signal having a certain voltage is biased onto the read electrode pair, the closer to the surface of clearance (i.e., the smaller the depth is), the larger the intensity of the electric field will be, and vice versa. The distribution of the depth of electric field of ferroelectric thin film layer at the clearance is varied with a variation of the externally applied voltage. When the electric field at a certain depth from the surface of clearance reaches the coercive field E, required for reversing the electric domain, the electric domain of partial ferroelectric thin film layer above this depth will all be reversed in a way similar to that shown in FIG. 4(*b*) or 5(*b*). Therefore, the larger the voltage of read signal is, the deeper the domain wall conductive passage will be. FIG. 9 shows the distributions of the domain wall conductive passage in the ferroelectric thin film layer when biased under three different read signal voltages of 1V, 2.5V and 4V. Therefore, a read operation can be performed on the ferroelectric memory of the embodiment of the invention under a relatively small voltage, and the power consumption of read operation is low.

Figure 10:
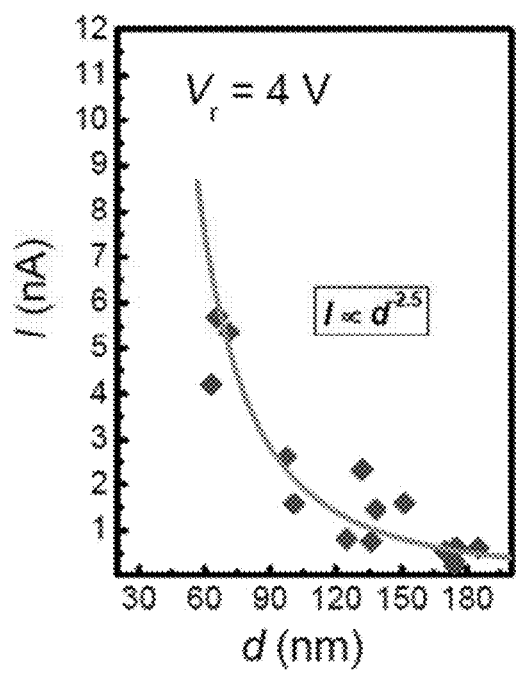
FIG. 10 is a schematic view showing a relationship between an on-state read current I and a clearance distance d in the ferroelectric memory according to the first embodiment of the invention under a read signal of 4V.

FIG. 10 is a schematic view showing a relationship between an on-state read current I and a clearance distance d in the ferroelectric memory according to the first embodiment of the invention under a read signal of 4V, wherein the dots represent values of experimental results, the solid line represents a schematic theoretical simulation result. As can be known, when the read voltage $V_{read}$=4V, the on-state read current I is in direct proportion to $d^{-2.5}$, that is, when the clearance d becomes smaller, the on-state read current I can be increased sharply. Therefore, even if the ferroelectric memory is scaling down, the clearance in the ferroelectric memory can be scaled correspondingly. Moreover, the on-state read current will not be reduced, and the reading of logic information has a high degree of identification. Therefore, it is highly advantageous for a small-size and high-density application.

The ferroelectric memory according to the embodiment of the invention makes use of the clearance provided in the first electrode layer. During a read operation, the electric field across the clearance can partially reverse the electric domain of a part of the ferroelectric thin film layer so as to create the domain wall conductive passage. Therefore, a non-destructive readout can be realized by way of current; moreover, the on-state current that is readout when creating the domain wall conductive passage can be increased with a decrease of the interval of the clearance. Therefore, the ferroelectric memory according to the embodiment of the invention is highly advantageous for a small-size and high-density application.

Figure 11:
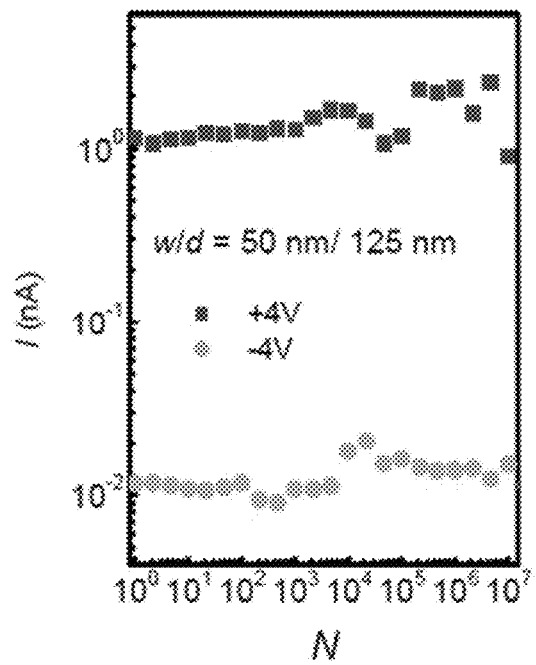
FIG. 11 is a schematic view showing a relationship between on-state current and off-state current and the time N of reading and writing in the ferroelectric memory according to the first embodiment of the invention under a read pulse voltage having a magnitude of +/−4V and a frequency of 1 kHz.

FIG. 11 is a view showing a relationship between on-state current and off-state current and the time N of reading and writing in the ferroelectric memory according to the first embodiment of the invention under a read pulse voltage having a magnitude of +/−4V and a frequency of 1 kHz, wherein the clearance d=125 nm, and the width of the read electrode portion w=50 nm. Therefore, a read and write operation can be performed continuously and circularly in the ferroelectric memory of the embodiment.

Figure 12:
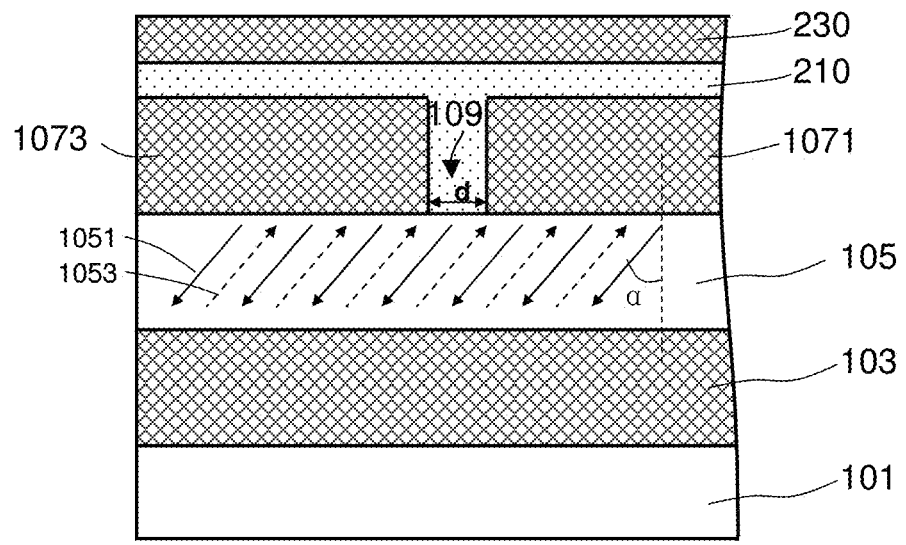
FIG. 12 is a schematic sectional structure view of a non-destructive readout ferroelectric memory according to a second embodiment of the invention.

FIG. 12 is a schematic sectional structure view of a non-destructive readout ferroelectric memory according to a second embodiment of the invention. In this embodiment, the read electrode portion 1071 and the read electrode portion 1073 do not constitute an upper electrode layer in the ferroelectric memory 20. Therefore, in this embodiment, the ferroelectric memory 20 comprises an insulation dielectric layer 210 formed above the read electrode portion 1071 and the read electrode portion 1073, and an upper electrode layer 230 formed on the insulation dielectric layer 210. The ferroelectric memory 20 also comprises a substrate 101, a lower electrode layer 103, a ferroelectric thin film layer 105 and a clearance 109, etc., as shown in FIG. 1, which will not be described repeatedly. Therefore, the process and principle of the readout operation of the ferroelectric memory 20 is substantially the same as those of the ferroelectric memory 10 shown in FIG. 1.

Figure 13:
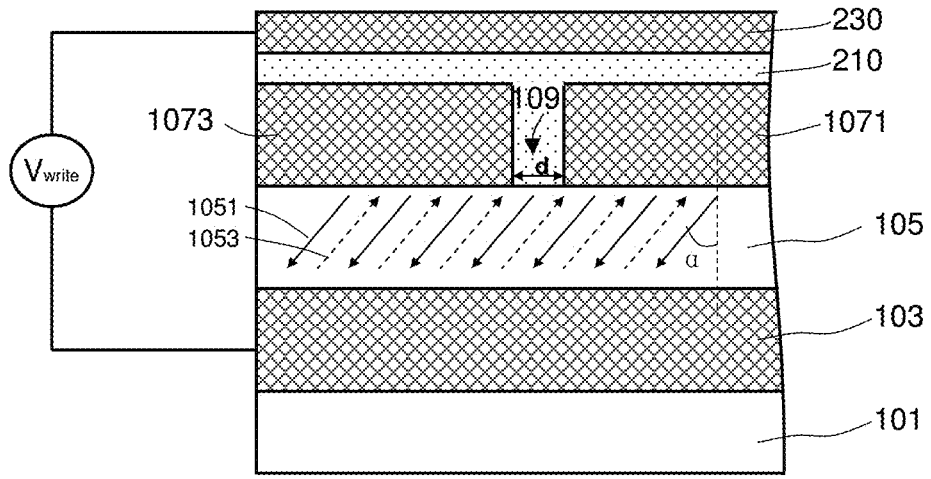
FIG. 13 is a schematic view showing the principle of a writing operation of the ferroelectric memory according to the embodiment shown in FIG. 12.

FIG. 13 is a schematic view showing the principle of a writing operation of the ferroelectric memory according to the embodiment shown in FIG. 12. In this embodiment, a voltage $V_{write}$ at least larger than the coercive electric field of the ferroelectric thin film layer 105 is applied between the upper electrode layer 230 and the lower electrode layer 103 so that the electric domain 1051 or 1053 is turned over, thus realizing writing logic information "1" or "0" of the ferroelectric memory 20.

It is noted that in the ferroelectric memory of the above embodiment, the clearance 109 can be filled or partially filled with the insulation dielectric layer 210, or is not filled with the insulation dielectric layer 210.

Figure 14:
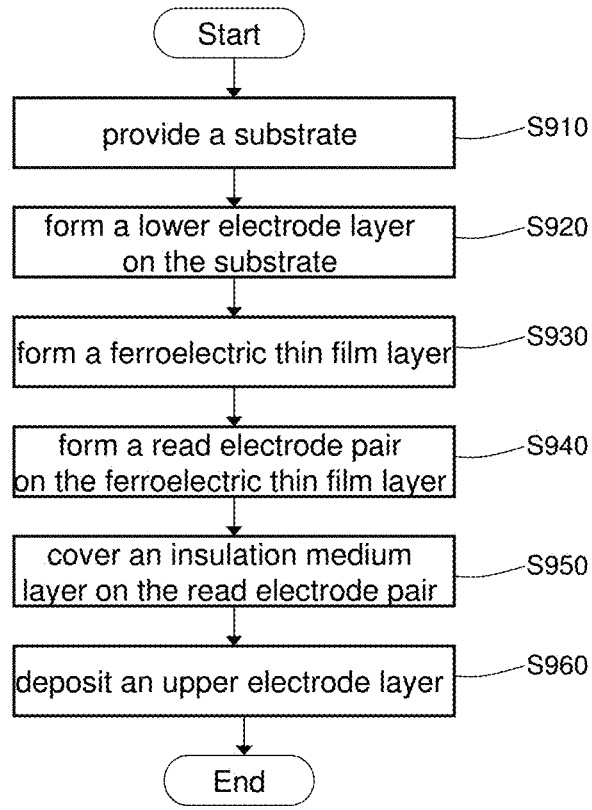
FIG. 14 is a schematic view showing the process of the method of preparing the ferroelectric memory according to the first embodiment of the invention.

FIG. 14 is a schematic view showing the process of the method of preparing the ferroelectric memory according to the first embodiment of the invention. With reference to FIGS. 1, 12 and 14, firstly, at step S910, a substrate 100 shown in FIG. 1 or 12 is provided, the material of the substrate 100 is mainly determined by the lower electrode layer 103 and the ferroelectric thin film layer 105 together. In this embodiment, the substrate 101 can be a Si substrate which is easily compatible with a semiconductor CMOS process.

Next, at step S920, the lower electrode layer 103 is formed on the substrate 101. In this embodiment, the material of the lower electrode layer 103 can be selected from one of Pt, $SrRuO_3$ and $LaNiO_3$ or a combination of more than one of Pt, $SrRuO_3$ and $LaNiO_3$. The thickness of the lower electrode layer 103 can be 50-100 nm, e.g., 80 nm. The lower electrode layer 103 can be formed by, for example, but not limited to, thin film deposition methods such as sputtering, chemical vapor deposition (CVD), pulse laser deposition (PLD), etc.

Next, at step S930, the ferroelectric thin film layer 105 is formed. In this embodiment, the material of the ferroelectric thin film layer 105 can be selected from the followings: $BiFeO_3$, $(Bi, La)FeO_3$, $(Pb, Zr)TiO_3$ or $LiNbO_3$, but is not limited thereto. The ferroelectric thin film layer 105 can be formed by thin film deposition methods such as sputtering, chemical vapor deposition (CVD), pulse laser deposition (PLD), etc.

Next, at step S940, the read electrode pair is formed on the ferroelectric thin film layer 105. In this embodiment, the read electrode pair is constituted by the read electrode portion 1071 and the read electrode portion 1073, between which the clearance 109 having a nanometer-order dimension is formed. The read electrode pair can be selected from one of Pt, $SrRuO_3$ and $LaNiO_3$ or a combination of more than one of Pt, $SrRuO_3$ and $LaNiO_3$. The thickness of the read electrode portion 1071 and/or the read electrode portion 1073 can be 5-100 nm, e.g., 20 nm. The read electrode portion 1071 and/or the read electrode portion 1073 can be formed by, for example, but not limited to, thin film deposition methods such as sputtering, chemical vapor deposition (CVD), pulse laser deposition (PLD), etc. The clearance 109 can be obtained by, for example, but not limited to, electron beam processing, nano-imprint or other photo-etching methods.

In this way, the ferroelectric memory of the embodiment shown in FIG. 1 is substantially formed. In this embodiment, the read electrode portion 1071 and the read electrode portion 1073 also form the upper electrode layer of the memory.

Next, at step S950, the insulation dielectric layer 210 shown in FIG. 12 is covered on the read electrode pair.

Next, at step S960, the upper electrode layer 230 shown in FIG. 12 is formed by deposition. The upper electrode 230, used in a write operation process, can be a continuous metal layer for forming the upper electrode layer of the ferroelectric memory 20 in the embodiment shown in FIG. 12.

Hitherto, the ferroelectric memory 20 in the embodiment shown in FIG. 12 is substantially formed.

Therefore, as compared to the process of preparing a FRAM having a conventional ferroelectric capacitor structure, the ferroelectric memory in the embodiment of the invention increases less process steps and the process of preparation is not complicated.

Figure 15:
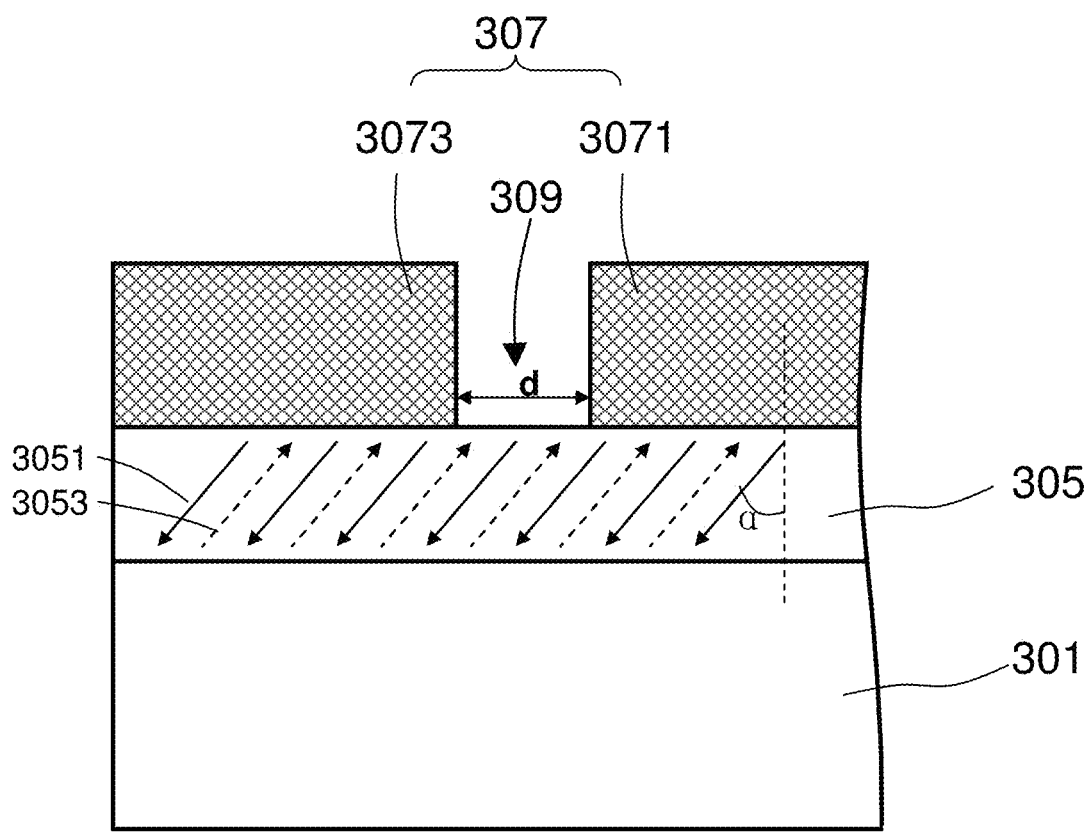
FIG. 15 is a schematic sectional structure view of a non-destructive readout ferroelectric memory according to a third embodiment of the invention.
Figure 16:
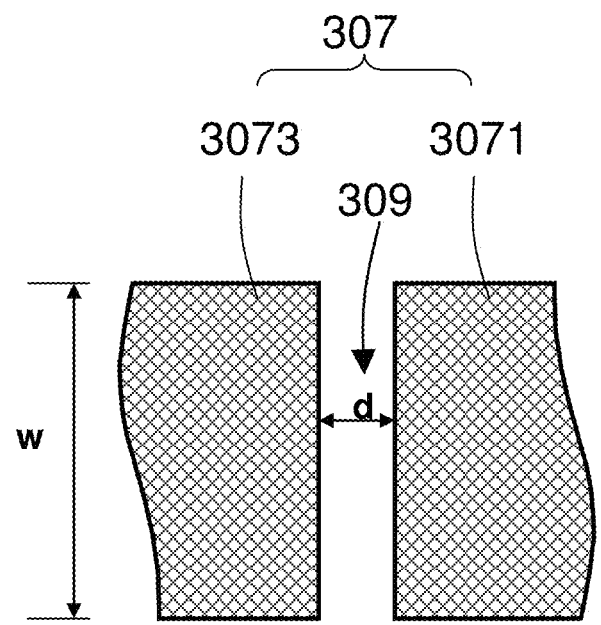
FIG. 16 is a top plan structure view of an upper electrode of the non-destructive readout ferroelectric memory shown in FIG. 15.

FIG. 15 is a schematic sectional structure view of a non-destructive readout ferroelectric memory according to a third embodiment of the invention; and FIG. 16 is a top plan structure view of an upper electrode of the non-destructive readout ferroelectric memory shown in FIG. 15. As shown in FIG. 15, a partial sectional structure of a ferroelectric memory 30 is shown, which mainly comprises a substrate 301, a ferroelectric thin film layer 305 and a first electrode layer 307, wherein the first electrode layer 307 is defined as a read-write electrode layer 307 which is provided on the ferroelectric thin film layer 305 and is in contact with the ferroelectric thin film layer 305 so that an electric field signal can be biased onto the ferroelectric thin film layer 305. The ferroelectric memory 30 in the embodiment of the invention differs from a conventional ferroelectric memory in that it does not need a lower electrode layer provided on an opposite side to the read-write electrode layer 307. In the ferroelectric memory 30, the read-write electrode layer 307 can be used not only for realizing a read operation, but also for realizing a write operation. Therefore, the first electrode layer 307 is also called read-write electrode layer 307.

With continued reference to FIGS. 15 and 16, the read-write electrode layer 307 is provided therein with a clearance 309 which divides the read-write electrode layer 307 into several portions. In this example, the clearance 309 divides the read-write electrode layer 307 into at least two portions, i.e., a read-write electrode portion 3071 and a read-write electrode portion 3073 which constitute a read-write electrode pair. In this embodiment, this read-write electrode pair mainly constitutes the read-write electrode layer 307 of this embodiment.

With continued reference to FIG. 15, the substrate 301 can be formed by various substrate materials commonly used in a ferroelectric memory, e.g., Si, $SrTiO_3$ or $LiNbO_3$. Usually, the material of the substrate 301 is mainly determined by the substrate 301 and the ferroelectric thin film layer 305 together. In this embodiment, the substrate 301 can be Si substrate which is easily compatible with a semiconductor CMOS process and is advantageous for a massive production. In addition, the substrate material such as $SrTiO_3$ or $LiNbO_3$ is typically selected according to lattice constant requirements on the ferroelectric thin film layer 305 so that an epitaxial thin film layer with excellent performance is obtained.

The ferroelectric thin film layer 305 grows on the substrate 301 and can be formed of a ferroelectric material having a suitable domain structure. Specifically, the material of the ferroelectric thin film layer 305 can be selected from the followings: $BiFeO_3$, (Bi, La) $FeO_3$, (Pb, Zr) $TiO_3$ or $LiNbO_3$; however, it is to be understood that the specific type of the ferroelectric material of the ferroelectric thin film layer 305 is not limiting, and those skilled in the art can select any type of ferroelectric material. The method for preparing the ferroelectric thin film layer 305 is also not limiting. For example, it can be formed by thin film deposition methods such as sol-gel process, sputtering, CVD, PLD, etc. The thickness of the ferroelectric thin film layer 305 can be in a range from larger than or equal to 5 nm to smaller than or equal to 500 nm, e.g., it could be 20 nm, 30 nm, 50 nm or 100 nm.

The read-write electrode portion 3071 and the read-write electrode portion 3073 in this embodiment can be formed by pattern etching the clearance 309 on a continuous metal thin film layer. Of course, in other embodiments, the read-write electrode portion 3071 and the read-write electrode portion 3073 can be formed by patterning respectively. In this specification, the read-write electrode portion 3071 and the read-write electrode portion 3073 form a read-write electrode pair. Herein, the term "read" reflects that they have at least the function of readout operation, while the term "write" reflects that they have at least the function of write operation.

The read-write electrode portion 3071 and/or the read-write electrode portion 3073 can be formed of a conductive material having a low resistance. For example, the material of the read-write electrode portion 3071 and the read-write electrode portion 3073 can be selected from one of Pt, $SrRuO_3$ and $LaNiO_3$ or a combination of more than one of Pt, $SrRuO_3$ and $LaNiO_3$. The thickness of the read-write electrode portion 3071 and/or the read-write electrode portion 3073 can be 5-100 nm, e.g., 20 nm. The read-write electrode portion 3071 and/or the read-write electrode portion 3073 can be formed by, for example, but not limited to, thin film deposition methods such as sputtering, vaporization, CVD, PLD, etc.

The clearance 309 is used for realizing a relative electric isolation between the read-write electrode portion 3071 and the read-write electrode portion 3073 (the electric isolation does not include a following situation in which a domain wall conductive passage is established during a read operation process). The clearance 309 can be obtained by processing a flat metal layer with electron beam, nano-imprint or other photo-etching methods. However, the methods of forming the clearance 309 are not limited to the embodiments of the invention. The interval d of the clearance 309 can be in a range from larger than or equal to 2 nm to smaller than or equal to 500 nm, preferably from larger than or equal to 5 nm to smaller than or equal to 100 nm, e.g. it could be 10 nm, 135 nm, 125 nm, etc. A smaller interval d is more advantageous for improving a storage density of the ferroelectric memory, more advantageous for reducing a read voltage and increasing a read current, and will lead to less read power consumption. Therefore, the clearance 309 can be a clearance 309 having various nanometer-order dimensions. The shape of the clearance 309 is not limited to the shape shown in FIG. 16. In other embodiments, the clearance 309 can even have a serrated shape. The dimension of the width w (i.e., a width dimension of the clearance) of the read-write electrode portion 3071 and the read-write electrode portion 3073 in a direction perpendicular to the clearance can be in a range from larger than or equal to 5 nm to smaller than or equal to 500 nm, e.g., it could be 50 nm.

Figure 17:
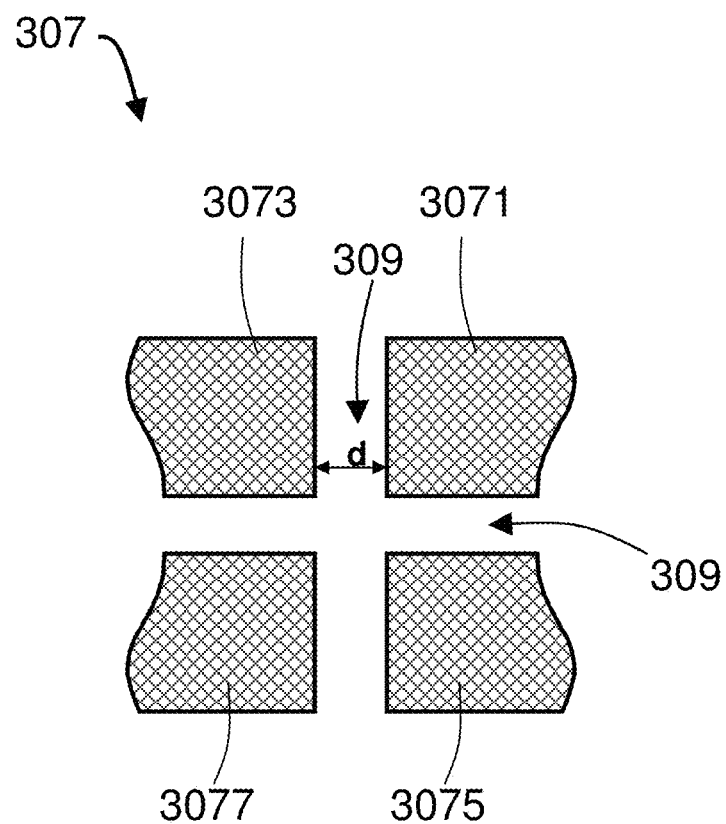
FIG. 17 is another top plan structure view of the upper electrode of the non-destructive readout ferroelectric memory shown in FIG. 15.

FIG. 17 is another top plan structure view of the upper electrode of the non-destructive readout ferroelectric memory shown in FIG. 15. In this embodiment, the clearance 309 divides the read-write electrode layer 307 into four portions, i.e., a read-write electrode portion 3071, a read-write electrode portion 3073, a read-write electrode portion 3075 and a read-write electrode portion 3077. Any two adjacent read-write electrode portions on two sides of the clearance 309 can form a read-write electrode pair. For example, the read-write electrode portion 3073 and the read-write electrode portion 3077, as well as the read-write electrode portion 3075 and the read-write electrode portion 3077; of course, the four read-write electrode portions shown in FIG. 17 can also form a read-write electrode pair.

With continued reference to FIG. 15, in the invention, the ferroelectric thin film layer 305 is required to satisfy a condition that the ferroelectric domain thereof has a component in a plane, i.e., it has an in-plane component (a projection of spontaneous polarization of the ferroelectric domain onto a film plane). The ferroelectric thin film layer 305 can form electric domains 3051 or 3053 in the two directions as shown in FIG. 15. The polarization direction of the electric domain 3051 is completely opposite to the polarization direction of the electric domain 3053. When a biasing voltage is larger than a coercive voltage, the electric domain will be oriented in the electric field direction. Therefore, when the biasing electric field direction is opposite to the original electric domain direction and the biasing voltage is larger than the coercive voltage, the electric domain 3051 or 3053 will be reversed. In this embodiment, the polarization direction of the electric domain of the ferroelectric thin film layer 305 is substantially not parallel to a normal line (a broken line perpendicular to the ferroelectric thin film layer 305 as shown in the figure) direction of the ferroelectric thin film layer 305, or is substantially not perpendicular to the read-write electrode layer 307. Specifically, as shown in FIG. 15, an angle α formed between the normal line of the ferroelectric thin film layer 305 and the polarization direction of electric domain is not equal to 0° or 180°. For example, ≤α≤60°. Also, for example, α=45°. In this way, the electric domain has an in-plane component. Specifically, it can be realized by controlling a crystal orientation in which the ferroelectric thin film layer 305 grows. By way of example, a BiFeO3 ferroelectric thin film layer 305 having a thickness of 100 nm can grow epitaxially on the SrTiO3 substrate 301 having a crystal face (001), wherein the polarization direction of the electric domain of the BiFeO3 ferroelectric thin film layer 305 is along a direction <111>.

Figure 18:
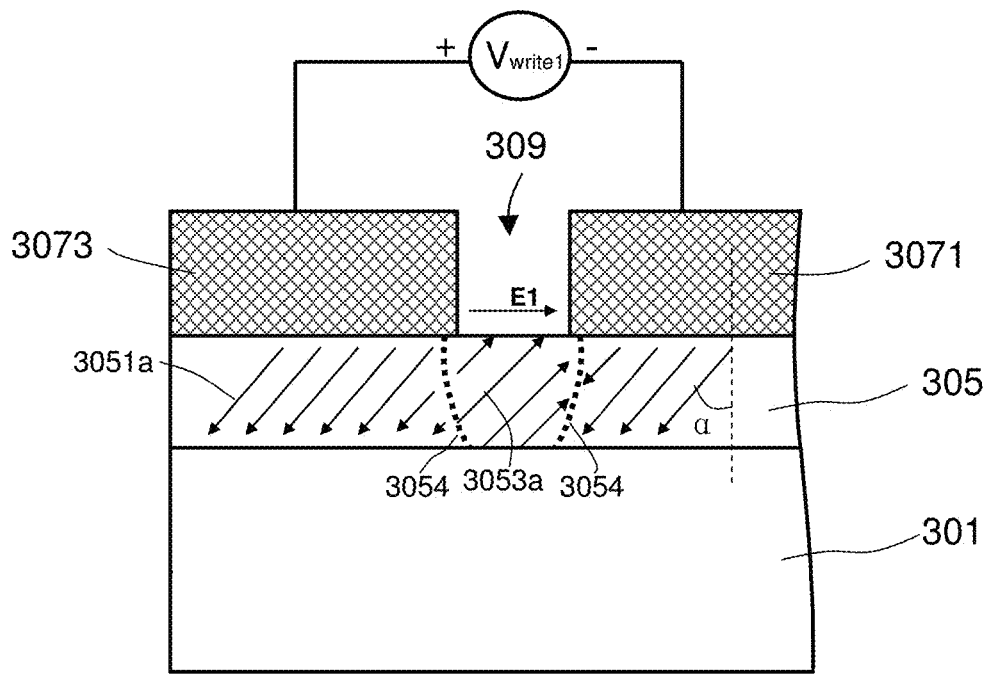
FIG. 18 is a schematic view showing the principle of the operation of writing "1" and writing "0" of the ferroelectric memory according to the embodiment shown in FIG. 15.
Figure 18:
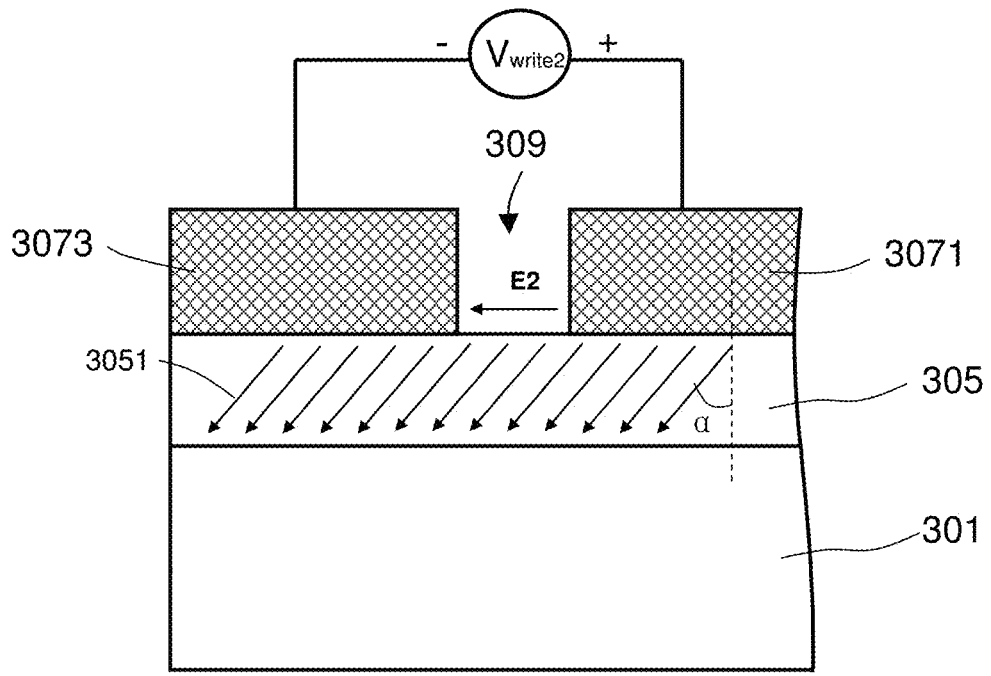

FIG. 18 is a schematic view showing the principle of the operation of writing "1" and writing "0" of the ferroelectric memory according to the embodiment shown in FIG. 15.

In this embodiment, a description will be illustratively given in an example in which logic information "0" is stored in the polarization direction in which an electric domain 3051 of the ferroelectric thin film layer 305 is positioned. As shown in FIG. 18(a), during an operation of write "1", a write signal $V_{write1}$ is biased between the read-write electrode portion 3073 and the read-write electrode portion 3071 of the read-write electrode layer 307, i.e., a write signal $V_{write1}$ is biased across the read-write electrode pair constituted by the read-write electrode portion 3073 and the read-write electrode portion 3071. The direction of the write signal is such that the read-write electrode portion 3073 is biased in a positive direction, and the read-write electrode portion 3071 is biased in a negative direction, thus forming an electric field E1 substantially in the direction shown in FIG. 18(a). Due to existence of the clearance 309, the electric field E1 can have an influence on the electric domain of a part of the ferroelectric thin film layer which corresponds to the clearance 309. When an electric field component of the electric field E1 in a direction opposite to the polarization direction of the electric domain 3051 is larger than a coercive voltage for reversing the electric domain, the electric domain 3051 is reversed so as to form an electric domain 3053a (the direction of electric domain 3053a is substantially the same as the polarization direction of the electric domain 3053 shown in FIG. 15). As can be known from a distribution of electric field intensity of the ferroelectric thin film layer 305 under the effect of the write signal $V_{write1}$, the larger the write voltage of $V_{write1}$ is, the deeper the depth of reversed electric domain 3053a will be. Therefore, by controlling the magnitude of the voltage of write signal and/or by controlling the thickness of the ferroelectric thin film layer 305, the reversed electric domain 3053a can longitudinally (in a direction perpendicular to the ferroelectric thin film layer 305) penetrate the ferroelectric thin film layer 305; as illustratively shown in FIG. 18(a), under the effect of a write signal $V_{write1}$ of a write voltage having a certain magnitude (e.g., +4V), the electric domain of a part of the ferroelectric thin film layer 305 corresponding to the clearance 309 (i.e., the electric domain in the ferroelectric thin film layer 305 substantially below the clearance 309) is substantially completely reversed to form the electric domain 3053a.

The electric domain in other portions of the ferroelectric thin film layer 305 is not reversed since it is substantially not affected by the electric field E1 (or, the influence by the electric field E1 is not sufficient to reverse the electric domain thereof), and correspondingly, an electric domain 3051a as shown in FIG. 18 is formed, i.e., a part of the electric domain other than the reversed electric domain 3051 constitutes the electric domain 3051a. The polarization direction of the electric domain 3053a is substantially completely opposite to that of the electric domain 3051a. Therefore, at a boundary wall or interface between the electric domain 3051a and the electric domain 3053a, a domain wall or domain boundary 3054 having charges is generated. However, the conductive passage corresponding to the domain wall 3054 will shutdown near the substrate, and will not affect the read current in the readout process. Thus, it is preferable that the substrate 301 can be an insulation substrate formed of various insulation materials. In the embodiment of the invention, the domain wall 3054 formed after the write "1" operation penetrates the ferroelectric thin film layer 305, i.e., it penetrates an upper surface and a lower surface of the ferroelectric thin film layer 305. In this way, the electric domain 3053a is not surrounded by the electric domain 3051a from four sides, will not automatically return to a state before write "1" operation under the effect of de-polarization, and the written logic information is saved; the specific shape of the domain wall 3054 is not limited to the shape illustrated in the embodiment of the invention. For example, two domain walls 3054 can form a substantially column shape.

Since the electric domain 3053a is reversed using an electric field component of the electric field E1 in a direction opposite to the polarization direction of the electric domain 3051a. Therefore, in case that the coercive voltage of the ferroelectric thin film layer and the thickness of the ferroelectric thin film layer are known, a minimum write voltage $V_{write1}$ for forming the electric domain 3053a can be calculated.

As shown in FIG. 18(b), during an operation of write "0", a write signal $V_{write2}$ is biased across the read-write electrode pair constituted by the read-write electrode portion 3073 and the read-write electrode portion 3071. The direction of the write signal $V_{write2}$ is opposite to that of the write signal $V_{write1}$, wherein the read-write electrode portion 3073 is biased in a negative direction, and the read-write electrode portion 3071 is biased in a positive direction, thus forming an electric field E2 substantially in the direction shown in FIG. 18(b). Due to existence of the clearance 309, the electric field E2 can have an influence on the electric domain of a part of the ferroelectric thin film layer which corresponds to the clearance 309, i.e., can have an influence on the electric domain 3053a shown in FIG. 18(a). When an electric field component of the electric field E2 in a direction opposite to the polarization direction of the electric domain 3053a is larger than a coercive voltage for reversing the electric domain, the electric domain 3053a is reversed so as to restore to the initial or original polarization direction, thus forming the electric domain 3051 uniformly. At this point, the logic information is written as "0".

Similarly, as can be known from a distribution of electric field intensity of the ferroelectric thin film layer 305 under the effect of the write signal $V_{write2}$, the larger the write voltage of $V_{write2}$ is, the deeper the depth of reversed and restored electric domain 3053a will be. Therefore, by controlling the magnitude of the voltage of write signal, the electric domain 3053a is completely returned to the electric domain 3051 by restoring; as illustratively shown in FIG. 18(b), under the effect of a write signal $V_{write2}$ of a write voltage having a certain magnitude (e.g., −4V), the electric domain 3053a of a part of the ferroelectric thin film layer 305 corresponding to the clearance 309 (i.e., the electric domain 3053a in the ferroelectric thin film layer 305 substantially below the clearance 309) is completely reversed to form the electric domain 3051, and the domain wall 3054 disappears.

The specific form of signals of the write signal $V_{write1}$ and the write signal $V_{write2}$ is not limiting. For example, it can be a pulse voltage signal with a certain frequency.

Figure 19:
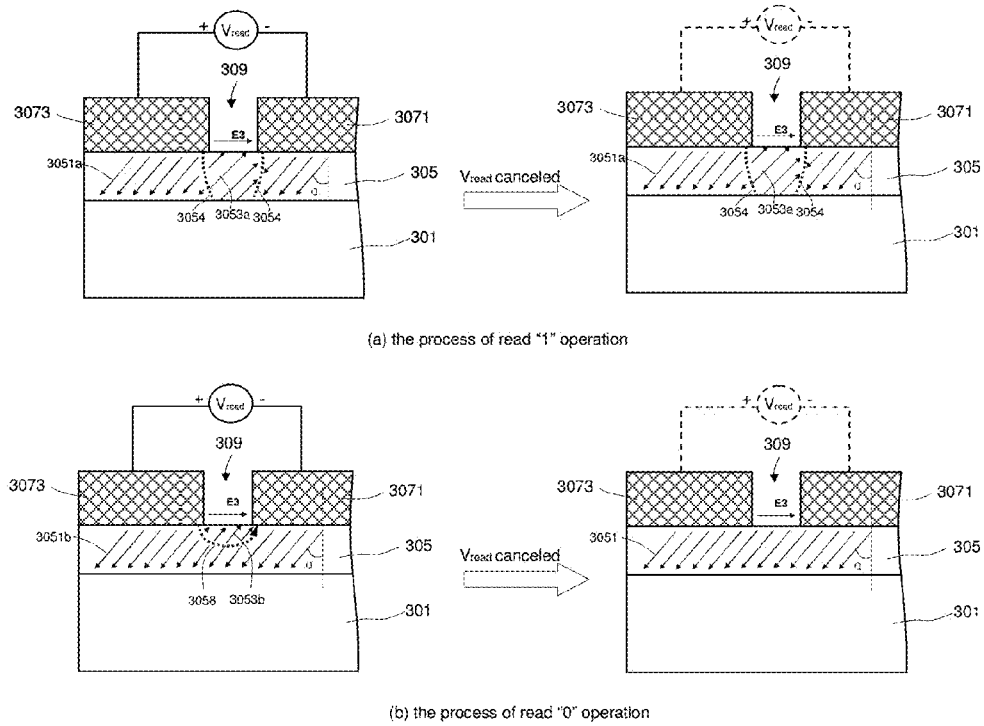
FIG. 19 is a schematic view showing the process and principle of the operation of reading "1" and reading "0" of the ferroelectric memory according to the embodiment shown in FIG. 15.

FIG. 19 is a schematic view showing the process and principle of the operation of reading "1" and reading "0" of the ferroelectric memory according to the embodiment shown in FIG. 15.

In this embodiment, the principle of write operation is completely different from that of a conventional ferroelectric memory. Specifically, during a write operation, the substrate 301 needs no biasing signals and can be vacant, and a read signal $V_{read}$ is biased between the read-write electrode pair. A description will be given in an example in which a signal is biased between the read-write electrode portion 3071 and the read-write electrode portion 3073.

As shown in FIG. 19(a), during an operation of read "1", a read signal $V_{read}$ is biased between the read-write electrode portion 3071 and the read-write electrode portion 3073, wherein the read-write electrode portion 3073 is biased in a positive direction, and the read-write electrode portion 3071 is biased in a negative direction, thus forming an electric field E3 (which is defined as "+" read voltage at this point) in the direction as shown between the read-write electrode portion 3073 and the read-write electrode portion 3071. Due to existence of the clearance 309, the electric field E3 can partially have an influence on the electric domain of a part of the ferroelectric thin film layer which corresponds to the clearance 309. Since the electric field E3 does not contain an electric field component for reversing the electric domain 3053a, no matter how the read voltage of the read signal $V_{read}$ increases, the electric domain 3053a will remain completely constant, and no conductive passage can be formed between the read-write electrode portion 3073 and the read-write electrode portion 3071. At this point, the read current $I_{read}$=0, and the read current $I_{read}$ is in an off state, meaning that logic information "1" is read out.

It is noted that preferably, the read voltage of the read signal $V_{read}$ is smaller than a write voltage of the write signal $V_{write1}$ so as to avoid an over-write operation during a read operation.

With continued reference to FIG. 19(a), when the read signal $V_{read}$ is removed, since the electric domain in the ferroelectric thin film layer is substantially not changed in the above read operation, the electric domain in the ferroelectric thin film layer will also not be changed after the read signal $V_{read}$ is is removed.

As shown in FIG. 19(b), during an operation of read "0", a read signal $V_{read}$ is biased between the read-write electrode portion 3071 and the read-write electrode portion 3073, thus forming an electric field E3 in the direction as shown. Due to existence of the clearance 309, the electric field E3 can partially have an influence on the electric domain of a part of the ferroelectric thin film layer which corresponds to the clearance 309. As shown in FIG. 19(b), as the electric field E3 increases, in a corresponding part of the ferroelectric thin film layer 305 below the clearance 309, i.e., in a local part of the surface portion exposed to the clearance 309, the electric domain is reversed. That is, the electric domain 3051 is partially reversed to form the electric domain 3053b shown in FIG. 19(b), and the electric domain in other portions of the ferroelectric thin film layer 305 is not reversed since it is substantially not affected by the electric field E3 (or, the influence by the electric field E3 is not sufficient to reverse the electric domain thereof), and correspondingly, an electric domain 3051b as shown is formed. The polarization direction of the electric domain 3053b is substantially opposite to that of the electric domain 3051b, wherein the electric domain 3053b is reversed using an electric field component of the electric field E3 in a direction opposite to the polarization direction of the electric domain 3051. Therefore, in case that the coercive voltage of the ferroelectric thin film layer is known, a minimum read voltage $V_{read}$ for forming the electric domain 3053b can be calculated.

At this point, at an adjoining portion of the part of the ferroelectric thin film layer having the electric domain 3051b and the part of the ferroelectric thin film layer having the electric domain 3053b, i.e., at a boundary wall or interface between the electric domain 3051b and the electric domain 3053b, a domain wall or domain boundary 3058 having charges is generated. Therefore, mainly on the basis of domain wall conductive mechanism, a conductive passage 3058 is created between the read-write electrode portion 3073 and the read-write electrode portion 3071, i.e., "domain wall conductive passage", and correspondingly, a read current signal $I_{read}$ is generated. At this point, the read current signal $I_{read}$ is in an on-state, meaning that a logic signal "0" is read out.

Therefore, the above process of read operation is completely different from the charge reading method in a ferroelectric memory having a conventional capacitor structure. In the embodiments of the application, a way is implemented in which logic signals are accessed by current.

Further, after the read current signal $I_{read}$ is read out, the read voltage signal $V_{read}$ between the read electrode portion 3073 and the read electrode portion 3071 is canceled; as shown in FIG. 19(b), the electric field E3 disappears. At this point, under the effect of de-polarization field, the electric domain 3053b will be influenced by the electric domain 3051b and will be reversed to substantially the original polarization direction. That is, the electric domain 3053b disappears instantly and substantially restores to the electric domain 3051 in a state before the read operation. The domain wall 3058 also substantially disappears, and the conductive passage generated previously also disappears. Therefore, the logic information "0" stored by the ferroelectric memory 30 before the read operation does not change after the read operation, thus realizing a non-destructive accessing.

Meanwhile, it is understood that in other embodiments, even if there is a situation in which the electric domain 3053b is not reversed to the polarization direction before the read operation after the electric field E3 disappears, i.e., the conductive passage is always open after the read signal is removed, since the direction of the read signal $V_{read}$ is relatively fixed, the electric domain 3053b will not affect the stored logic information, and the existence of the conductive passage will not affect the logic information that is read out later. Moreover, it is understood that when a write operation is performed after the read operation, the electric domain 3053b will definitely be re-polarized, and the conductive passage will be erased.

With continued reference to FIG. 19(b), in this embodiment, it would be better for the volume of a portion of the ferroelectric thin film layer having the electric domain 3053b to be as small as possible as compared to a portion of the volume of the ferroelectric thin film layer having the electric domain 3051b, i.e., it would be better for the proportion of the portion of the ferroelectric thin film layer having an electric domain (e.g., electric domain 3053b) which is partially reversed during the read operation to be as small as possible. By designing the thickness of the ferroelectric thin film layer 305, area parameters, read voltage and/or the interval d of the clearance 309, the read operation performance of the ferroelectric memory can be optimized. For example, the interval d of the clearance 309 is smaller than or larger than the thickness of the ferroelectric thin film layer 305.

It is understood that while the above description is given in an example in which the polarization direction of the electric domain 3051 of the ferroelectric thin film layer 305 represents stored logic information "0", those skilled in the art will understand that the polarization direction of the electric domain 3051/3053 of the ferroelectric thin film layer 305 can also represent stored logic information "1"/"0", and the voltage signal direction in a corresponding write operation and read operation can be also changed adaptively so as to realize a read and write operation similar to those shown in FIGS. 18 and 19.

Figure 20:
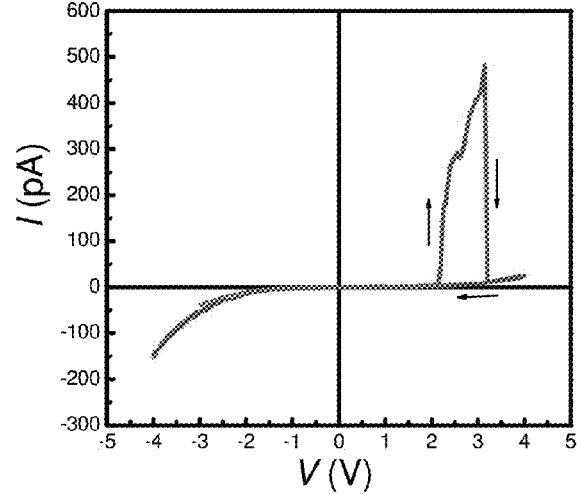
FIG. 20 is an I-V graph in an operation of sweeping the voltage across the read-write electrode pair of the ferroelectric memory having stored logic information of "0"/"1" according to the third embodiment of the invention when the write voltage is +/−4V.

FIG. 20 is an I-V graph in an operation of sweeping the voltage across the read-write electrode pair of the ferroelectric memory having stored logic information of "0"/"1" according to the third embodiment of the invention when the write voltage is +/−4V. In connection with the ferroelectric memory having stored logic information "0" shown in FIG. 19(b) and taking a clearance d=55.6 nm and a read-write electrode portion width w=62.5 nm as an example, firstly, a "+" direction sweeping is performed, and an electric field similar to the electric field E3 shown in FIG. 19(b) is formed between the read-write electrode pair. With the increase of the electric field, the electric domain of a local part of the surface portion exposed to the clearance 309 is reversed, and an electric domain in [1, 1, 1] direction or [−1, −1, −1] direction is gradually formed, for example. The domain wall or domain boundary having charges is enlarged gradually. When the voltage in increased to about +2.1V, the current between the read-write electrode pair is increased suddenly, and it means that now a domain wall conductive passage which connects the read-write electrode pair is formed in the ferroelectric thin film layer, and the read current is in an "on state (on)"; in case that the electric field across the read-write electrode pair continues to increase, when the voltage in increased to about +3.1V, the current I decreases sharply; in case that the electric field across the read-write electrode pair continues to increase, when the voltage in increased to about +4V, the part of the ferroelectric thin film layer 305 between the clearance 309 and the substrate 301 is completely reversed, i.e., the electric domain 3053b as shown in FIG. 19(b) is enlarged to form the electric domain 3053a as shown in FIG. 18(a), thus realizing a reverse write-in of logic information "1". At this point, the domain wall 3054 is interrupted at the substrate 101. Therefore, the current I is substantially reduced to 0 and is in an "off-state (off)".

When a sweeping continues to be performed from about +4V towards 0V, since the electric domain of a part of the ferroelectric thin film layer 305 corresponding to the clearance 309 longitudinally penetrates the ferroelectric thin film layer 305, i.e., the electric domain 3053a of a part of the ferroelectric thin film layer between the clearance 309 and the substrate 301 is completely reversed. As shown in FIG. 18(a), it is difficult for the electric domain 3051a to have a de-polarization effect on the electric domain 3053a, the polarization direction of the electric domain 3053a remains unchanged, and the conductive passage no longer exists. Therefore, the current I is substantially reduced to 0.

It is noted that whether a read signal or a write signal is biased across the read-write electrode pair, the distribution of the depth of the electric field in the ferroelectric thin film layer at the clearance will change with an externally applied read voltage. When a read signal or a write signal having a certain voltage is biased across the read-write electrode pair, the electric field intensity is larger when it comes closer to the surface of the clearance (i.e., the depth becomes smaller), and vice versa. The distribution of the depth of the electric field at the clearance varies with a variation of the externally applied voltage. When the electric field at a certain depth from a surface of the clearance reaches a coercive field E, required for reversing the electric domain, the electric domain of the part of the ferroelectric thin film layer above this depth will be reversed similar to that shown in FIG. 18(a) or FIG. 19(b). Therefore, the larger the voltage of the read signal is, the deeper the domain wall conductive passage will be, the larger the voltage of the write signal will be, and the more perpendicular to the surface of the substrate 301 the domain wall 3054 will be.

It can be known from the principle of the above write operation and the read operation that the read voltage of the read signal $V_{read}$ should be such that the depth of the formed domain wall conductive passage is smaller than the thickness of the ferroelectric thin film layer. For example, it should be smaller than a voltage point similar to the 3.1V shown in FIG. 20. Therefore, the read voltage of the read signal $V_{read}$ should be smaller than the write voltage of the write signal $V_{write}$.

Figure 21:
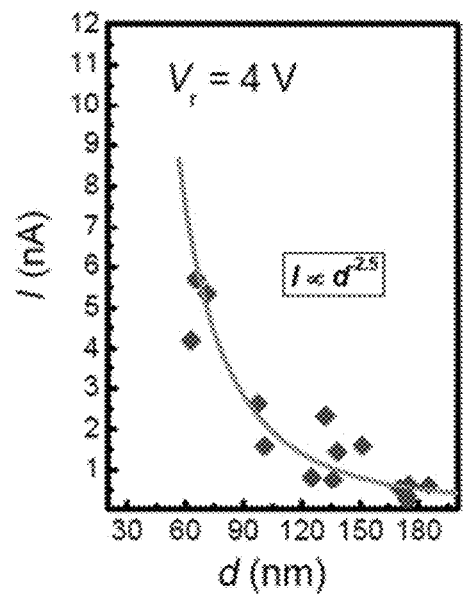
FIG. 21 is a schematic view showing a relationship between an on-state read current I and a clearance distance d in the ferroelectric memory according to the third embodiment of the invention under a read signal of 3V.

FIG. 21 is a schematic view showing a relationship between an on-state read current I and a clearance distance d in the ferroelectric memory according to the third embodiment of the invention under a read signal of 3V, wherein the dots represent values of experimental results, the solid line represents a schematic theoretical simulation result. As can be known, when the read voltage $V_{read}$=3V, the on-state read current I is in direct proportion to $d^{-2.5}$, that is, when the clearance d becomes smaller, the on-state read current I can be increased sharply. Therefore, even if the ferroelectric memory is scaling down, the clearance in the ferroelectric memory can be scaled correspondingly. Moreover, the on-state read current will not be reduced, and the reading of logic information has a high degree of identification. Therefore, it is highly advantageous for a small-size and high-density application.

The ferroelectric memory according to the third embodiment of the invention makes use of the clearance provided in the read-write electrode layer. During a read operation, the electric field across the clearance can partially reverse the electric domain of a part of the ferroelectric thin film layer so as to create the domain wall conductive passage. Therefore, a non-destructive readout can be realized by way of current; moreover, the on-state current that is readout when creating the domain wall conductive passage can be increased with a decrease of the interval of the clearance; meanwhile, during a write operation, the smaller the interval of the clearance is, the smaller the thickness of the ferroelectric thin film layer will be, and the lower the write voltage of the write signal could be. Therefore, the ferroelectric memory according to the embodiment of the invention is highly advantageous for a small-size and high-density application, and can easily meet the requirements of continuously scaling down the size of device.

Figure 22:
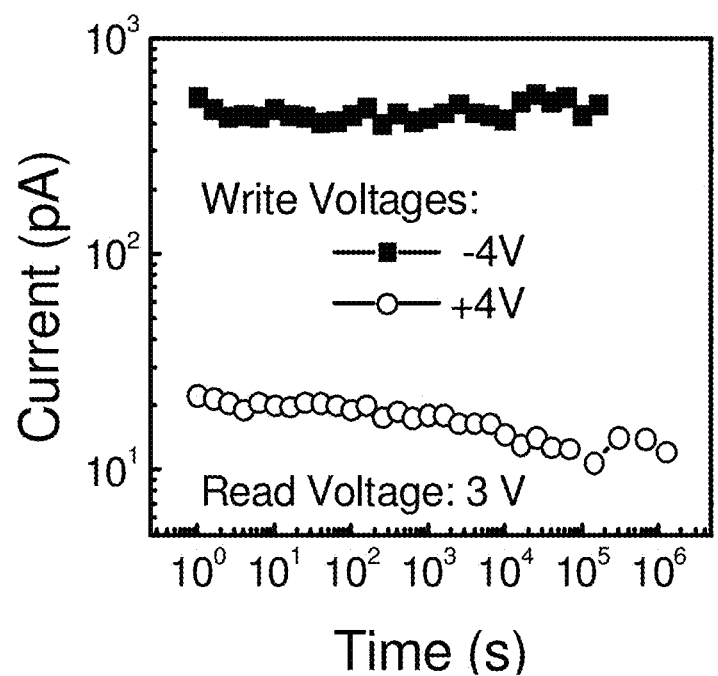
FIG. 22 is a view showing the variation of read current with data retention time of the ferroelectric memory according to the third embodiment of the invention after a write "1"/"0" operation under +/−4V.

FIG. 22 is a view showing the variation of read current with data retention time of the ferroelectric memory according to the third embodiment of the invention after a write "1"/"0" operation under +/−4V, wherein the read voltage is +3V, and the magnitude of the read current is related to the direction of the write signal, i.e., related to the write-in direction of the electric domain. Moreover, whether in the "1" state or in the "0" state, the read current can substantially remain constant over time, meaning that the electric domain written-in based on the principle shown in FIG. 18 can have a good retention characteristic, and the ferroelectric memory 30 has a good logic information retention characteristic.

It is noted that in the ferroelectric memory of the above third embodiment, the clearance 309 can be filled or partially filled with the insulation dielectric layer, or is not filled with the insulation dielectric layer.

Figure 23:
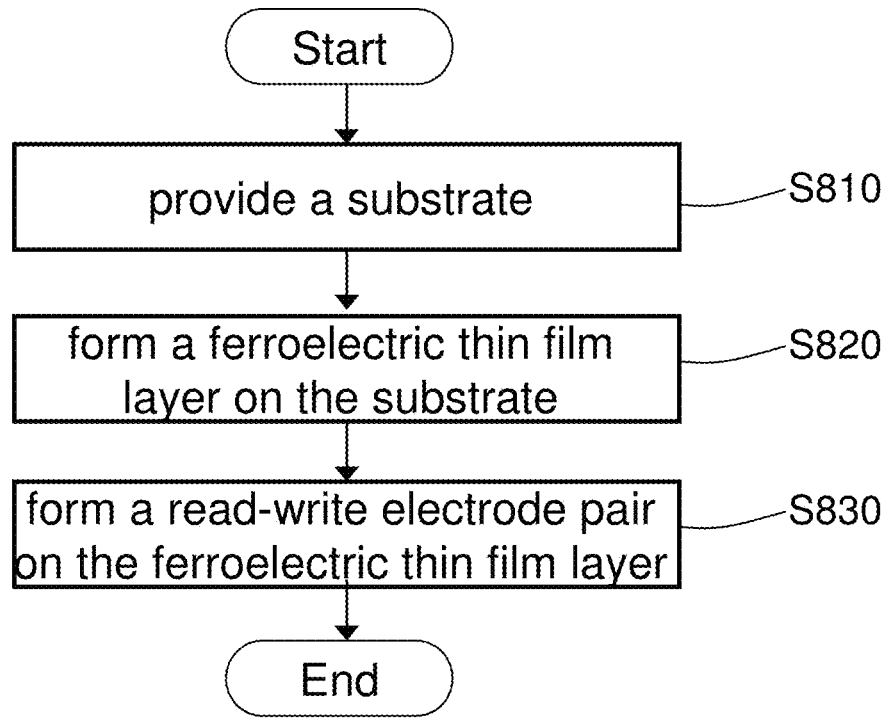
FIG. 23 is a schematic view showing the process of the method of preparing the ferroelectric memory according to the third embodiment of the invention.

FIG. 23 is a schematic view showing the process of the method of preparing the ferroelectric memory according to the third embodiment of the invention. With reference to FIGS. 15 and 23, firstly, at step S810, a substrate 100 shown in FIG. 15 is provided, the material of the substrate 100 is mainly determined by the ferroelectric thin film layer 305 altogether. In this embodiment, the substrate 301 can be a Si substrate which is easily compatible with a semiconductor CMOS process.

Next, at step S820, the ferroelectric thin film layer 305 is formed. In this embodiment, the material of the ferroelectric thin film layer 305 can be selected from the followings: $BiFeO_3$, (Bi, La) $FeO_3$, (Pb, Zr) $TiO_3$ or $LiNbO_3$, but is not limited thereto. The ferroelectric thin film layer 305 can be formed by thin film deposition methods such as sputtering, CVD, PLD, etc.

In other embodiments, a medium layer can be firstly formed on the substrate before the ferroelectric thin film layer 305 is formed on the substrate.

Next, at step S830, a read-write electrode pair is formed on the ferroelectric thin film layer 305. In this embodiment, the read-write electrode pair is constituted by the read-write electrode portion 3071 and the read-write electrode portion 3073, between which the clearance 309 having a nanometer-order dimension is formed. The read-write electrode pair can be selected from one of Pt, $SrRuO_3$ and $LaNiO_3$ or a combination of more than one of Pt, $SrRuO_3$ and $LaNiO_3$. The thickness of the read-write electrode portion 3071 and/or the read-write electrode portion 3073 can be 5-100 nm, e.g., 20 nm. The read-write electrode portion 3071 and/or the read-write electrode portion 3073 can be formed by, for example, but not limited to, thin film deposition methods such as sputtering, chemical CVD, PLD, etc. The clearance 309 can be obtained by, for example, but not limited to, electron beam processing, nano-imprint or other photo-etching methods.

In other embodiments, an insulation dielectric layer can be also filled into the clearance 309.

In this way, the ferroelectric memory in the embodiment shown in FIG. 15 is substantially formed. In this embodiment, the read-write electrode portion 3071 and the read-write electrode portion 3073 are also used for forming the upper electrode layer 307 of the memory.

Therefore, as compared to the process of preparing a FRAM having a conventional ferroelectric capacitor structure, the ferroelectric memory in the third embodiment of the invention does not need a lower electrode layer and has a very simple structure. The process of preparation is very simple and the cost is low.

Figure 24:
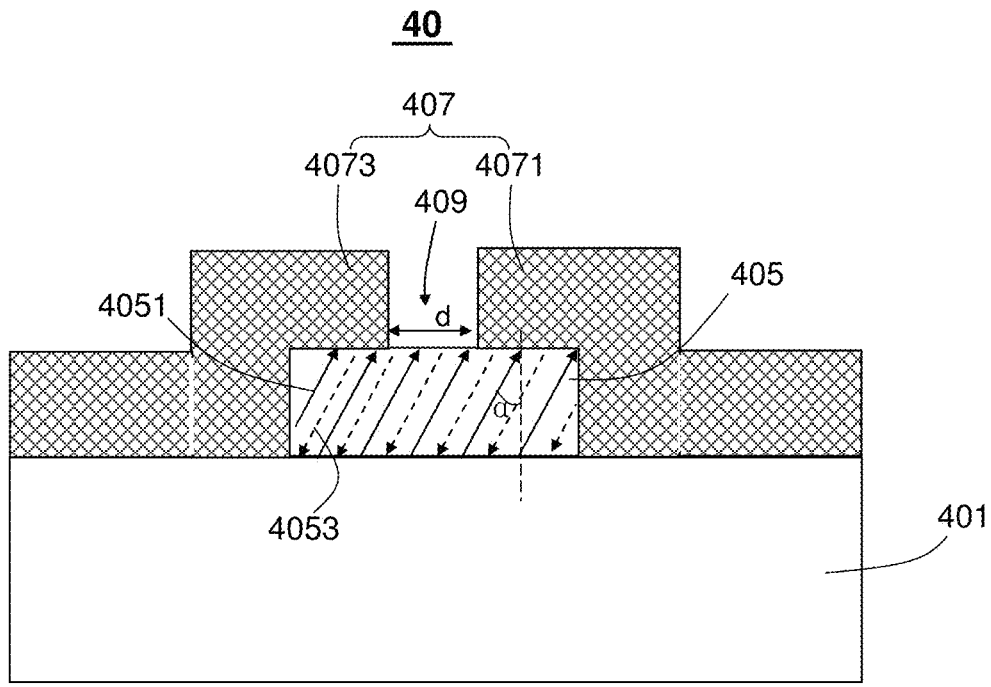
FIG. 24 is a schematic sectional structure view of a non-destructive readout ferroelectric memory according to a fourth embodiment of the invention.

FIG. 24 is a schematic sectional structure view of a non-destructive readout ferroelectric memory according to a fourth embodiment of the invention. As shown in FIG. 24, a partial sectional structure of a ferroelectric memory 40 is shown, which mainly comprises a substrate 401, a ferroelectric thin film layer 405 and a first electrode layer 407, wherein the first electrode layer 407 is defined as a read-write electrode layer 407 which is provided on the ferroelectric thin film layer 405 and is in contact with the ferroelectric thin film layer 405 so that an electric field signal can be biased onto the ferroelectric thin film layer 405. The ferroelectric memory 40 in the embodiment of the invention differs from a conventional ferroelectric memory in that it does not need a lower electrode layer provided on an opposite side to the read-write electrode layer 407. In the ferroelectric memory 40, the read-write electrode layer 407 can be used not only for realizing a read operation, but also for realizing a write operation. Therefore, the first electrode layer 407 is also called read-write electrode layer 407.

The read-write electrode layer 407 in the ferroelectric memory 40 is also provided therein with a clearance 409 which divides the read-write electrode layer 407 into at least two portions, i.e., a read-write electrode portion 4071 and a read-write electrode portion 4073 which constitute a read-write electrode pair. In this embodiment, this read-write electrode pair mainly constitutes the read-write electrode layer 407 of this embodiment.

As compared to the ferroelectric memory 30 in the embodiment shown in FIG. 15, the read-write electrode layer 407 in the ferroelectric memory 40 is configured substantially the same as the read-write electrode layer in the ferroelectric memory 30. The main difference lies in that the read-write electrode layer 407 is substantially formed on the ferroelectric thin film layer 405 in a surrounding manner, wherein at least a part of the read-write electrode layer 407 is formed on the ferroelectric thin film layer 405, though a part of the read-write electrode layer 407 is formed directly on the substrate 401.

As compared to the ferroelectric memory 30 in the embodiment shown in FIG. 15, the substrate 401 in the ferroelectric memory 40 is configured substantially the same as the substrate 301 in the ferroelectric memory 30.

The ferroelectric thin film layer 405 is formed on the substrate 401 and a ferroelectric thin film layer 405 having a smaller area can be formed by pattern-etching. The ferroelectric thin film layer 405 can be formed of a ferroelectric material having a suitable domain structure. Specifically, the material of the ferroelectric thin film layer 405 can be selected from the followings: $BiFeO_3$, (Bi, La) $FeO_3$, (Pb, Zr) $TiO_3$ or $LiNbO_3$; however, it is to be understood that the specific type of the ferroelectric material of the ferroelectric thin film layer 405 is not limiting, and those skilled in the art can select any type of ferroelectric material. The method for preparing the ferroelectric thin film layer 405 is also not limiting. For example, it can be formed by thin film deposition methods such as sol-gel process, sputtering, CVD, PLD, etc. The thickness of the ferroelectric thin film layer 405 can be in a range from larger than or equal to 5 nm to smaller than or equal to 500 nm, e.g., it could be 20 nm, 30 nm, 50 nm or 100 nm.

The clearance 409 is used for realizing a relative electric isolation between the read-write electrode portion 4071 and the read-write electrode portion 4073 (the electric isolation does not include a following situation in which a domain wall conductive passage is established during a read operation process). The clearance 409 can be obtained by processing a flat metal layer with electron beam, nano-imprint or other photo-etching methods. However, the methods of forming the clearance 409 are not limited to the embodiments of the invention. The interval d of the clearance 409 can be in a range from larger than or equal to 2 nm to smaller than or equal to 500 nm, preferably from larger than or equal to 5 nm to smaller than or equal to 100 nm, e.g. it could be 10 nm, 135 nm, 125 nm, etc. A smaller interval d is more advantageous for improving a storage density of the ferroelectric memory, more advantageous for reducing a read voltage and increasing a read current, and will lead to less read power consumption. Therefore, the clearance 409 can be a clearance 409 having various nanometer-order dimensions. The shape of the clearance 409 is not limited to the shape shown in FIG. 24. In other embodiments, the clearance 409 can even have a serrated shape. The dimension of the width w (i.e., a width dimension of the clearance) of the read-write electrode portion 4071 and the read-write electrode portion 4073 in a direction perpendicular to the clearance can be in a range from larger than or equal to 5 nm to smaller than or equal to 500 nm, e.g., it could be 50 nm.

With continued reference to FIG. 24, in the invention, the ferroelectric thin film layer 405 is required to satisfy a condition that the ferroelectric domain thereof has a component in a plane, i.e., it has an in-plane component (a projection of spontaneous polarization of the ferroelectric domain onto a film plane). The ferroelectric thin film layer 405 can form electric domains 4051 or 4053 in the two directions as shown in FIG. 24. The polarization direction of the electric domain 4051 is completely opposite to the polarization direction of the electric domain 4053. When a biasing voltage is larger than a coercive voltage, the electric domain will be oriented in the electric field direction. Therefore, when the biasing electric field direction is opposite to the original electric domain direction and the biasing voltage is larger than the coercive voltage, the electric domain 4051 or 4053 will be reversed. In this embodiment, the polarization direction of the electric domain of the ferroelectric thin film layer 405 is substantially not parallel to a normal line (a broken line perpendicular to the ferroelectric thin film layer 405 as shown in the figure) direction of the ferroelectric thin film layer 405, or is substantially not perpendicular to the read-write electrode layer 407. Specifically, as shown in FIG. 24, an angle α formed between the normal line of the ferroelectric thin film layer 405 and the polarization direction of electric domain is not equal to 0° or 180°. For example, 30°. Also, for example, α=45°. In this way, the electric domain has an in-plane component. Specifically, it can be realized by controlling a crystal orientation in which the ferroelectric thin film layer 405 grows. By way of example, a $BiFeO_3$ ferroelectric thin film layer 405 having a thickness of 100 nm can grow epitaxially on the SrTiO3 substrate 401 having a crystal face (001), wherein the polarization direction of the electric domain of the $BiFeO_3$ ferroelectric thin film layer 405 is along a direction <111>.

Figure 25:
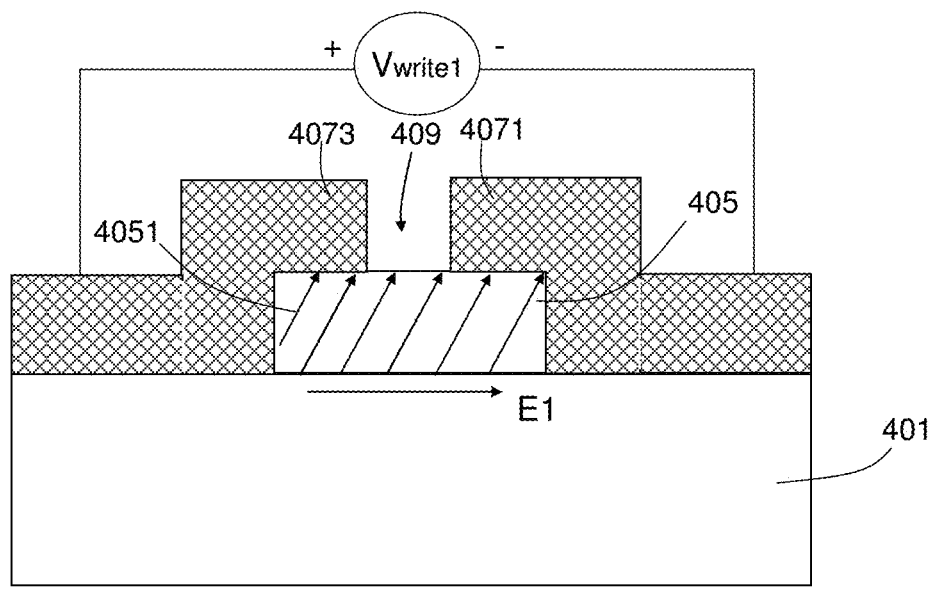
FIG. 25 is a schematic view showing the principle of the operation of writing "1" and writing "0" of the ferroelectric memory according to the embodiment shown in FIG. 24.
Figure 25:
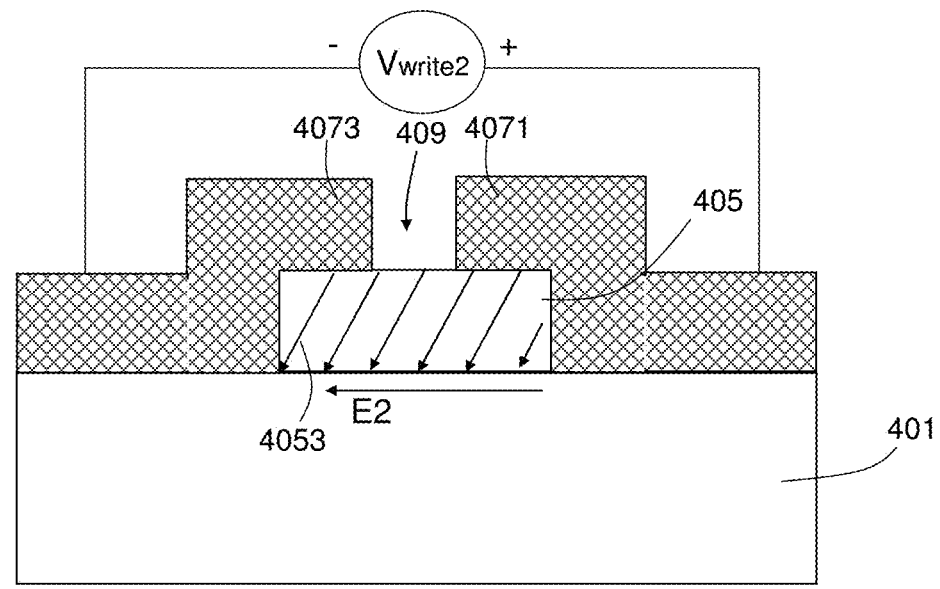

FIG. 25 is a schematic view showing the principle of the operation of writing "1" and writing "0" of the ferroelectric memory according to the embodiment shown in FIG. 24.

In this embodiment, a description will be illustratively given in an example in which logic information "1" is stored in the polarization direction in which an electric domain 3051 of the ferroelectric thin film layer 405 is positioned. As shown in FIG. 25(a), during an operation of write "1", a write signal $V_{write1}$ is biased between the read-write electrode portion 4073 and the read-write electrode portion 4071 of the read-write electrode layer 407, i.e., a write signal $V_{write1}$ is biased across the read-write electrode pair constituted by the read-write electrode portion 4073 and the read-write electrode portion 4071. The direction of the write signal is such that the read-write electrode portion 4073 is biased in a positive direction, and the read-write electrode portion 4071 is biased in a negative direction, thus forming an electric field E1 substantially in the direction shown in FIG. 28(a). During the write operation, the E1 can be made large enough by setting the magnitude of the voltage of the biasing write signal $V_{write1}$, so that an electric domain 4053 (if any) in a direction opposite to that of the electric domain 4051 is reversed to uniformly form the electric domain 4051 as shown in FIG. 28(a), thus accomplishing the write "1" operation.

In this embodiment, a description will be illustratively given in an example in which logic information "0" is stored in the polarization direction in which an electric domain 3053 of the ferroelectric thin film layer 405 is positioned. As shown in FIG. 25(b), a write signal $V_{write2}$ is biased between the read-write electrode portion 4073 and the read-write electrode portion 4071. The write signal $V_{write2}$ is in opposite direction to the write signal $V_{write1}$ so that an electric field E2 in an opposite direction can be applied to the ferroelectric thin film layer 405. Similarly, during the write operation, the E2 can be made large enough by setting the magnitude of the voltage of the biasing write signal $V_{write2}$, so that an electric domain 4051 (if any) in a direction opposite to that of the electric domain 4053 is reversed to uniformly form the electric domain 4053 as shown in FIG. 28(b), thus accomplishing the write "0" operation.

Figure 26:
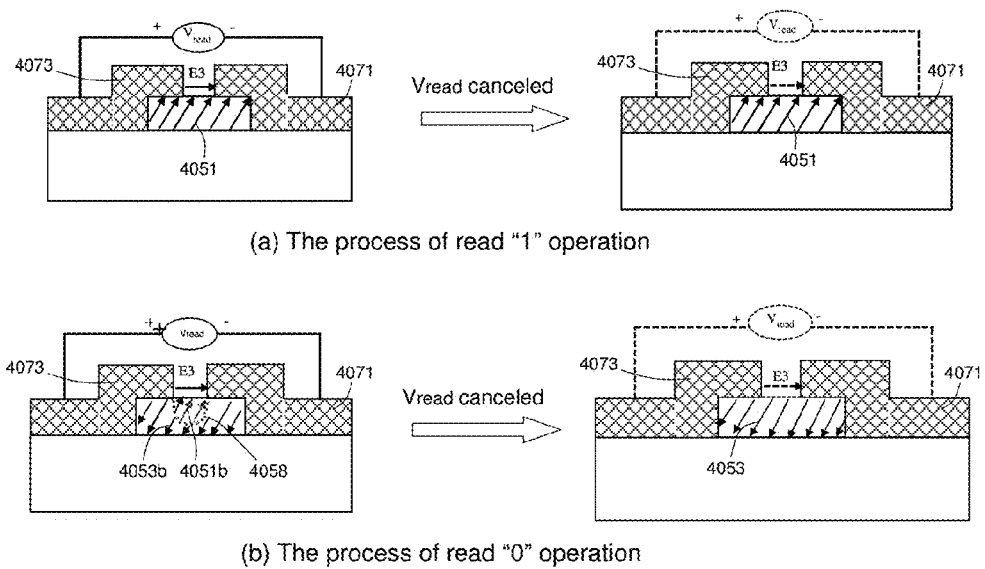
FIG. 26 is a schematic view showing the process and principle of the operation of reading "1" and reading "0" of the ferroelectric memory according to the embodiment shown in FIG. 24.

FIG. 26 is a schematic view showing the process and principle of the operation of reading "1" and reading "0" of the ferroelectric memory according to the embodiment shown in FIG. 24.

In this embodiment, the principle of read operation is completely different from that of a conventional ferroelectric memory, wherein during a read operation, the substrate 401 needs no biasing signals and can be vacant. The read signal $V_{read}$ is biased between the read-write electrode pair. A description will be given below in an example in which the read signal $V_{read}$ is biased between the read-write electrode portion 4071 and the read-write electrode portion 4073.

As shown in FIG. 26(a), during an operation of read "1", a read signal $V_{read}$ is biased between the read-write electrode portion 4071 and the read-write electrode portion 4073, wherein the read-write electrode portion 4073 is biased in a positive direction, and the read-write electrode portion 4071 is biased in a negative direction, thus forming an electric field E3 (which is defined as "+" read voltage at this point) in the direction as shown between the read-write electrode portion 4073 and the read-write electrode portion 4071. Since the electric field E3 does not contain an electric field component for reversing the electric domain 4051, no matter how the read voltage of the read signal $V_{read}$ increases, the electric domain 4051 will remain completely constant, and no conductive passage can be formed between the read-write electrode portion 4073 and the read-write electrode portion 4071. At this point, the read current $I_{read}=0$, and the read current $I_{read}$ is in an off state, meaning that logic information "1" is read out.

With continued reference to FIG. 26(a), when the read signal $V_{read}$ is removed, since the electric domain in the ferroelectric thin film layer is substantially not changed in the above read operation, the electric domain in the ferroelectric thin film layer will also not be changed after the read signal $V_{read}$ is removed.

As shown in FIG. 26(b), during an operation of read "0", a read signal $V_{read}$ is biased between the read-write electrode portion 4071 and the read-write electrode portion 4073, thus forming an electric field E3 in the direction as shown. Due to existence of the clearance 409, the electric field E3 can partially have an influence on the electric domain of a part of the ferroelectric thin film layer which corresponds to the clearance 409. As shown in FIG. 26(b), as the electric field E3 increases, in a corresponding part of the ferroelectric thin film layer 405 below the clearance 409, i.e., in a local part of the surface portion exposed to the clearance 409, the electric domain is reversed. That is, the electric domain 4053 is partially reversed to form the electric domain 4051b shown in FIG. 26(b), and the electric domain in other portions of the ferroelectric thin film layer 405 is not reversed since it is substantially not affected by the electric field E3 (or, the influence by the electric field E3 is not sufficient to reverse the electric domain thereof), and correspondingly, an electric domain 4053b as shown is formed. The polarization direction of the electric domain 4051b is substantially opposite to that of the electric domain 4053b, wherein the electric domain 4051b is reversed using an electric field component of the electric field E3 in a direction opposite to the polarization direction of the electric domain 4053. Therefore, in case that the coercive voltage of the ferroelectric thin film layer is known, a minimum read voltage $V_{read}$ for forming the electric domain 4051b can be calculated.

At this point, at an adjoining portion of the part of the ferroelectric thin film layer having the electric domain 4053b and the part of the ferroelectric thin film layer having the electric domain 4051b, i.e., at a boundary wall or interface between the electric domain 4051b and the electric domain 4053b, a domain wall or domain boundary 4058 having charges is generated. Therefore, mainly on the basis of domain wall conductive mechanism, a conductive passage 4058 is created between the read-write electrode portion 4073 and the read-write electrode portion 4071, i.e., "domain wall conductive passage", and correspondingly, a read current signal $I_{read}$ is generated. At this point, the read current signal $I_{read}$ is in an on-state, meaning that a logic signal "0" is read out.

Therefore, the above process of read operation is completely different from the charge reading method in a ferroelectric memory having a conventional capacitor structure. In the embodiments of the application, a way is implemented in which logic signals are read by current.

Further, after the read current signal $I_{read}$ is read out, the read voltage signal $V_{read}$ between the read electrode portion 4073 and the read electrode portion 4071 is removed; as shown in FIG. 26(b), the electric field E3 disappears. At this point, under the effect of de-polarization field, the electric domain 4051b will be influenced by the electric domain 4053b and will be reversed to substantially the original polarization direction. That is, the electric domain 4051b disappears instantly and substantially restores to the electric domain 4053 in a state before the read operation. The domain wall 4058 also substantially disappears, and the conductive passage generated previously also disappears. Therefore, the logic information "0" stored by the ferroelectric memory 40 before the read operation does not change significantly after the read operation, thus realizing a non-destructive accessing.

It is understood that while the above description is given in an example in which the polarization direction of the electric domain 4055 of the ferroelectric thin film layer 405 represents stored logic information "0", those skilled in the art will understand that the polarization direction of the electric domain 4053/4051 of the ferroelectric thin film layer 405 can also represent stored logic information "1"/"0", and the voltage signal direction in a corresponding write operation and read operation can be also changed adaptively so as to realize a read and write operation similar to those shown in FIGS. 25 and 26.

Figure 27:
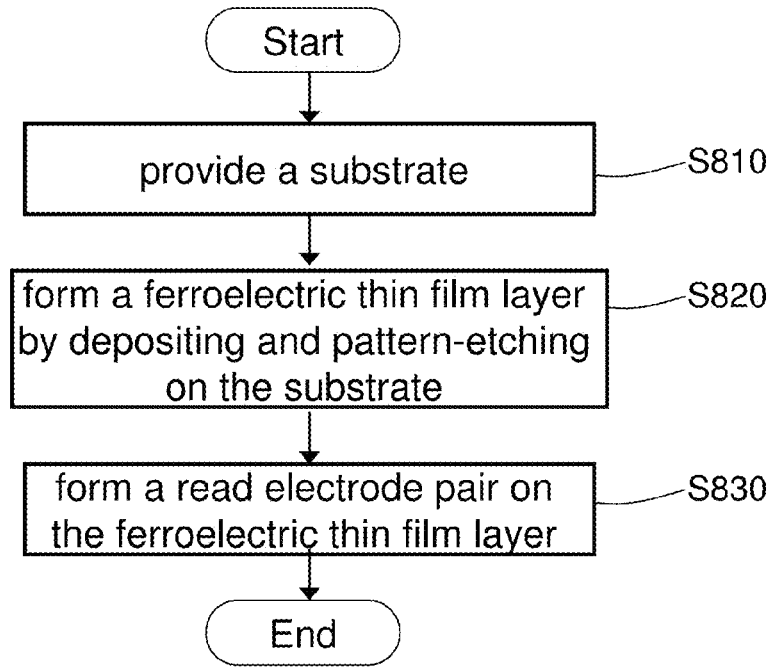
FIG. 27 is a schematic view showing the process of the method of preparing the ferroelectric memory according to the fourth embodiment of the invention.

FIG. 27 is a schematic view showing the process of the method of preparing the ferroelectric memory according to the fourth embodiment of the invention. With reference to FIGS. 24 and 27, firstly, at step S710, a substrate 400 shown in FIG. 24 is provided, the material of the substrate 400 is mainly determined by the ferroelectric thin film layer 405 altogether. In this embodiment, the substrate 401 can be a Si substrate which is easily compatible with a semiconductor CMOS process.

Next, at step S720, a ferroelectric thin film layer is deposited on the substrate 401 and the ferroelectric thin film layer is etched to form the ferroelectric thin film layer 405 shown in shown FIG. 24. The range of the size of the ferroelectric thin film layer 405 can be at a nanometer order.

Next, at step S730, a read-write electrode pair is formed on the ferroelectric thin film layer 405. In this embodiment, a metal layer is firstly deposited to cover the ferroelectric thin film layer 405. Then, a clearance 409 is correspondingly formed by etching on the ferroelectric thin film layer 405, thus forming a read-write electrode portion 4071 and a read-write electrode portion 4073 of the read-write electrode pair, wherein the clearance 409 can be obtained by, for example, but not limited to, electron beam processing, nano-imprint or other photo-etching methods.

In this way, the ferroelectric memory in the embodiment shown in FIG. 24 is substantially formed. The process of preparation is very simple and the cost is low.

In the above description, directional terms (e.g., "upper", "lower", etc.) and similar terms that are used to describe the components in various embodiments represent the directions shown in the drawings or directions that can be understood by those skilled in the art. These directional terms are used for a relative description and clarification, instead of limiting the orientation in any embodiment to a specific direction or orientation.

The above embodiments mainly describe the ferroelectric memory of the invention as well as a method of operating the same and a method of preparing the same. In particular, the method and principle of read operation are described. While only some of the embodiments of the invention are described, those skilled in the art will understand that the invention can be carried out in many other forms without departing from the spirit and scope thereof. Therefore, the disclosed examples and embodiments should be considered as illustrative rather than limiting. The invention can cover many variations and replacements without departing from the spirit and scope of the invention defined by the appended claims.

The invention claimed is:

1. A non-destructive readout ferroelectric memory, comprising:
   a ferroelectric thin film layer; and
   a first electrode layer at least partially disposed on the ferroelectric thin film layer;
   wherein a clearance is provided in the first electrode layer, the clearance being correspondingly located on the ferroelectric thin film layer and dividing the first electrode layer into at least two portions, and a polarization direction of the electric domain in the ferroelectric thin film layer is substantially not in parallel with a normal line direction of the ferroelectric thin film layer;
   wherein the ferroelectric thin film layer is configured such that when a read signal is biased between the two portions of the first electrode layer, an electric domain of a part of the ferroelectric thin film layer that corresponds to the clearance is partially reversed so that a domain wall conductive passage is established which enables the two portions of the first electrode layer to be electrically conductive.

2. The non-destructive readout ferroelectric memory according to claim 1, further comprising a second electrode layer disposed opposite to the first electrode layer, the ferroelectric thin film layer being between the first electrode layer and the second electrode layer, wherein the polarization direction of the electric domain of the ferroelectric thin film layer is also substantially not perpendicular to a normal line direction of the ferroelectric thin film layer.

3. The non-destructive readout ferroelectric memory according to claim 2, wherein the at least two portions in the first electrode layer comprises a first read electrode portion and a second read electrode portion which form a read electrode pair, and the read signal is biased across the read electrode pair.

4. The non-destructive readout ferroelectric memory according to claim 2, wherein a write signal is operably biased between the first electrode layer and the second electrode layer so that the polarization direction of the electric domain of the ferroelectric thin film layer is uniformly turned over.

5. The non-destructive readout ferroelectric memory according to claim 2, further comprising a third electrode layer disposed opposite to the second electrode layer,
   wherein a write signal is operably biased between the third electrode layer and the second electrode layer so that the polarization direction of the electric domain of the ferroelectric thin film layer is uniformly turned over; and
   an insulation dielectric layer which at least fills the clearance is provided between the third electrode layer and the first electrode layer.

6. The non-destructive readout ferroelectric memory according to claim 1, wherein the first electrode layer is a read-write electrode layer; and
   wherein the ferroelectric thin film layer is further configured such that when a write signal in a first direction is biased between the two portions in the read-write electrode layer, an electric domain of a part of the ferroelectric thin film layer which corresponds to the clearance is reversed in such a way that it longitudinally penetrates the ferroelectric thin film layer.

7. The non-destructive readout ferroelectric memory according to claim 6, wherein when a write signal in a second direction opposite to the first direction is biased between the two portions adjoining the clearance in the read-write electrode layer, the electric domain which was reversed in such a way that it longitudinally penetrates the ferroelectric thin film layer is reversed back to an original polarization direction.

8. The non-destructive readout ferroelectric memory according to claim 6, wherein the thickness of the ferroelectric thin film layer and/or the interval of the clearance is configured such that under a bias of a write voltage having a predetermined magnitude, the electric domain of the part of the ferroelectric thin film layer corresponding to the clearance can be reversed in such a way that it longitudinally penetrates the ferroelectric thin film layer.

9. The non-destructive readout ferroelectric memory according to claim 8, wherein the thickness of the ferroelectric thin film layer and/or the interval of the clearance are/is configured such that under a bias of a read voltage having a predetermined magnitude, the electric domain of the part of the ferroelectric thin film layer corresponding to the clearance can be partially reversed so as to create the domain wall conductive passage.

10. The non-destructive readout ferroelectric memory according to claim 1, wherein the first electrode layer is a read-write electrode layer, the at least two portions in the read-write electrode layer comprises a first read-write electrode portion and a second read-write electrode portion which constitute a read-write electrode pair, and the write signal or the read signal is biased across the read-write electrode pair.

11. The non-destructive readout ferroelectric memory according to claim 1, wherein when the electric domain of the ferroelectric thin film layer is uniformly turned over to be the electric domain in a first polarization direction, a first logic information is stored; and when the electric domain of the ferroelectric thin film layer is uniformly turned over to be the electric domain in a second polarization direction, a second logic information is stored, wherein the second polarization direction is opposite to the first polarization direction.

12. The non-destructive readout ferroelectric memory according to claim 1, wherein the ferroelectric thin film layer is further configured such that when the read signal biased between the two portions of the first electrode layer is removed, the reversed electric domain of the part of the ferroelectric thin film layer is restored to an original polarization direction and the domain wall conductive passage disappears.

13. The non-destructive readout ferroelectric memory according to claim 1, wherein when a read voltage of the read signal is fixed, an on-state current at the time of creating the domain wall conductive passage is increased with a decrease of the interval of the clearance; and/or
   the larger the read voltage of the read signal is, the greater the proportion of the reversed portion in the electric domain of the part of the ferroelectric thin film layer which corresponds to the clearance will be; and/or
   the larger the read voltage of the read signal is, the deeper the depth of the formed domain wall conductive passage from the surface of the clearance will be.

14. The non-destructive readout ferroelectric memory according to claim 1, wherein the interval of the clearance is in a range from larger than or equal to 2 nm to smaller than or equal to 500 nm, or in a range from larger than or equal to 5 nm to smaller than or equal to 100 nm; and
   the width of the clearance is in a range from larger than or equal to 5 nm to smaller than or equal to 500 nm.

15. The non-destructive readout ferroelectric memory according to claim 1, wherein the interval of the clearance is smaller than the thickness of the ferroelectric thin film layer or is smaller than a half of the thickness of the ferroelectric thin film layer.

16. The non-destructive readout ferroelectric memory according to claim 1, wherein the ferroelectric thin film layer is $BiFeO_3$, $(Bi, La) FeO_3$, $(Pb, Zr) TiO_3$ or $LiNbO_3$.

17. The non-destructive readout ferroelectric memory according to claim 1, wherein the thickness of the ferroelectric thin film layer is in a range from larger than or equal to 5 nm to smaller than or equal to 500 nm.

18. The non-destructive readout ferroelectric memory according to claim 1, wherein the thickness of the first electrode layer is in a range from larger than or equal to 5 nm to smaller than or equal to 100 nm.

19. The non-destructive readout ferroelectric memory according to claim 1, wherein a crystal orientation in which the ferroelectric thin film layer grows is controlled such that the polarization direction of the electric domain in the ferroelectric thin film layer is substantially not in parallel with a normal line direction of the ferroelectric thin film layer.

20. The non-destructive readout ferroelectric memory according to claim 1, wherein an insulation dielectric material is filled or partially filled in the clearance.

21. A method of preparing the non-destructive readout ferroelectric memory according to claim 1, comprising the steps of:
- providing a substrate;
- forming a ferroelectric thin film layer; and
- forming a first electrode layer having the clearance on the ferroelectric thin film layer.

22. The method of preparing according to claim 21, further comprising the step of:
- forming a second electrode layer on the substrate before the ferroelectric thin film layer is formed.

23. The method of preparing according to claim 22, further comprising the steps of:
- depositing an insulation dielectric layer on the first electrode layer; and
- forming a third electrode layer on the insulation dielectric layer.

24. A method of operating the non-destructive readout ferroelectric memory according to claim 1, wherein during a read operation, a read signal in a certain direction is biased between the two portions of the first electrode layer, and it is determined whether the domain wall conductive passage is successfully established by reading the magnitude of the current between the two portions so that the stored logic information is read out.

25. The method of operating according to claim 24, wherein the ferroelectric memory further comprises a second electrode layer disposed opposite to the first electrode layer, the ferroelectric thin film layer is provided between the first electrode layer and the second electrode layer; and
- wherein in the method of operating, during a write operation, a write signal is biased between the first electrode layer and the second electrode layer so that the polarization direction of the electric domain of the ferroelectric thin film layer is uniformly turned over.

26. The method of operating according to claim 25, wherein the non-destructive readout ferroelectric memory further comprises a third electrode layer disposed opposite to the second electrode layer; and
- wherein in the method of operating, during a write operation, a write signal is biased between the third electrode layer and the second electrode layer so that the polarization direction of the electric domain of the ferroelectric thin film layer is uniformly turned over.

27. The method of operating according to claim 24, wherein the first electrode layer is a read-write electrode layer; and
- wherein in the method of operating, during a write operation:
  - when a write signal in a first direction is biased between the two portions in the read-write electrode layer, an electric domain of a part of the ferroelectric thin film layer which corresponds to the clearance is reversed in such a way that it longitudinally penetrates the ferroelectric thin film layer, thus writing a first logic information; and
  - when a write signal in a second direction opposite to the first direction is biased between the two portions adjoining the clearance in the read-write electrode layer, the electric domain which was reversed in such a way that it longitudinally penetrates the ferroelectric thin film layer is reversed back to an original polarization direction, thus writing a second logic information.

28. The method of operating according to claim 27, wherein in the ferroelectric thin film layer, a domain wall is formed between the electric domain that is reversed in such a way that it longitudinally penetrates the ferroelectric thin film layer and the non-reversed electric domain, and the domain wall penetrates an upper surface and a lower surface of the ferroelectric thin film layer.

29. The method of operating according to claim 24, wherein after the read signal is removed, the electric domain partially reversed in the read operation is substantially restored to an original polarization direction before the read operation and the domain wall conductive passage thereby disappears.

30. The method of operating according to claim 24, wherein the first electrode layer is a read-write electrode layer;
- wherein in the method of operating, during a write operation:
  - a write signal in a first direction is biased between the two portions in the read-write electrode layer so that the electric domain in the ferroelectric thin film layer is uniformly turned over to a first polarization direction, thus accomplishing a write operation of a first logic information; and
  - a write signal in a second direction opposite to the first polarization direction is biased between the two portions in the read-write electrode layer so that the electric domain in the ferroelectric thin film layer is uniformly turned over to a second polarization direction, thus accomplishing a write operation of a second logic information; and
- wherein the first polarization direction is opposite to the second polarization direction.

31. The method of operating according to claim 24, wherein when a read voltage of the read signal is fixed, an on-state current at the time of creating the domain wall conductive passage is increased with a decrease of the interval of the clearance; and/or
- the larger the read voltage of the read signal is, the greater the proportion of the reversed portion in the electric domain of the part of the ferroelectric thin film layer corresponding to the clearance will be; and/or
- the larger the read voltage of the read signal is, the deeper the depth of the formed domain wall conductive passage from the surface of the clearance will be.

* * * * *